(12) United States Patent
Rearick et al.

(10) Patent No.: US 10,996,296 B2
(45) Date of Patent: *May 4, 2021

(54) RADIO FREQUENCY COIL TUNING METHODS AND APPARATUS

(71) Applicant: Hyperfine Research, Inc., Guilford, CT (US)

(72) Inventors: Todd Rearick, Cheshire, CT (US); Jeremy Christopher Jordan, Cromwell, CT (US); Gregory L. Charvat, Guilford, CT (US); Matthew Scot Rosen, Somerville, MA (US)

(73) Assignee: Hyperfine Research, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,126

(22) Filed: Jan. 6, 2020

(65) Prior Publication Data

US 2020/0142012 A1    May 7, 2020

Related U.S. Application Data

(63) Continuation of application No. 15/720,245, filed on Sep. 29, 2017, now Pat. No. 10,551,452.

(Continued)

(51) Int. Cl.
*G01R 33/36* (2006.01)
*G01R 33/44* (2006.01)

(52) U.S. Cl.
CPC ....... *G01R 33/3628* (2013.01); *G01R 33/445* (2013.01)

(58) Field of Classification Search
CPC ............ G01R 33/3628; G01R 33/3635; G01R 33/445
See application file for complete search history.

(56) References Cited

U.S. PATENT DOCUMENTS

| 4,545,384 A | 10/1985 | Kawachi |
| 4,633,181 A * | 12/1986 | Murphy-Boesch ......................... G01R 33/3628 324/318 |

(Continued)

FOREIGN PATENT DOCUMENTS

| CN | 101208610 A | 6/2008 |
| CN | 104067136 A | 9/2014 |

(Continued)

OTHER PUBLICATIONS

Invitation to Pay Fees for International Application No. PCT/US2017/54316 dated Nov. 9, 2017.

(Continued)

*Primary Examiner* — Patrick Assouad
*Assistant Examiner* — Demetrius R Pretlow
(74) *Attorney, Agent, or Firm* — Wolf, Greenfield & Sacks, P.C.

(57) ABSTRACT

Some aspects comprise a tuning system configured to tune a radio frequency coil for use with a magnetic resonance imaging system comprising a tuning circuit including at least one tuning element configured to affect a frequency at which the radio frequency coil resonates, and a controller configured to set at least one value for the tuning element to cause the radio frequency coil to resonate at approximately a Larmor frequency of the magnetic resonance imaging system determined by the tuning system. Some aspects include a method of automatically tuning a radio frequency coil comprising determining information indicative of a Larmor frequency of the magnetic resonance imaging system, using a controller to automatically set at least one value of a tuning circuit to cause the radio frequency coil to resonate at approximately the Larmor frequency based on the determined information.

20 Claims, 15 Drawing Sheets

Related U.S. Application Data

(60) Provisional application No. 62/401,657, filed on Sep. 29, 2016.

(56) References Cited

U.S. PATENT DOCUMENTS

| | | | |
|---|---|---|---|
| 4,742,304 A * | 5/1988 | Schnall | G01R 33/3635 |
| | | | 324/318 |
| 4,755,756 A | 7/1988 | Nishihara et al. | |
| 4,763,074 A * | 8/1988 | Fox | G01R 33/3678 |
| | | | 324/314 |
| 4,806,866 A | 2/1989 | Maier | |
| 4,837,516 A * | 6/1989 | Takahashi | G01R 33/3628 |
| | | | 324/318 |
| 4,920,318 A | 4/1990 | Misic et al. | |
| 5,036,426 A * | 7/1991 | Shen | G01R 33/3628 |
| | | | 324/318 |
| 5,041,788 A | 8/1991 | Kontor et al. | |
| 5,309,102 A | 5/1994 | Deckard | |
| 5,347,222 A * | 9/1994 | Fox | G01R 33/3628 |
| | | | 324/322 |
| 5,348,010 A | 9/1994 | Schnall et al. | |
| 5,592,083 A | 1/1997 | Magnuson et al. | |
| 5,912,558 A | 6/1999 | Halamek et al. | |
| 6,054,858 A | 4/2000 | Dumoulin et al. | |
| 6,194,898 B1 | 2/2001 | Magnuson et al. | |
| 6,424,154 B1 * | 7/2002 | Young | G01R 33/3635 |
| | | | 324/309 |
| 6,452,394 B1 | 9/2002 | Lappalainen | |
| 6,535,084 B1 | 3/2003 | Tropp | |
| 7,088,098 B1 * | 8/2006 | Lynch | G01R 33/3628 |
| | | | 324/307 |
| 8,380,282 B2 | 2/2013 | Franconi et al. | |
| 9,310,453 B2 | 4/2016 | Imamura et al. | |
| 9,541,616 B2 | 1/2017 | Rothberg et al. | |
| 9,547,057 B2 | 1/2017 | Rearick et al. | |
| 9,575,152 B1 | 2/2017 | Damadian | |
| 9,625,543 B2 | 4/2017 | Rearick et al. | |
| 9,625,544 B2 | 4/2017 | Poole et al. | |
| 9,638,773 B2 | 5/2017 | Poole et al. | |
| 9,645,210 B2 | 5/2017 | McNulty et al. | |
| 9,797,971 B2 | 10/2017 | Rearick et al. | |
| 9,817,093 B2 | 11/2017 | Rothberg et al. | |
| 10,139,464 B2 | 11/2018 | Rearick et al. | |
| 10,145,913 B2 | 12/2018 | Hugon et al. | |
| 10,145,922 B2 | 12/2018 | Rothberg et al. | |
| 10,222,434 B2 | 3/2019 | Poole et al. | |
| 10,222,435 B2 | 3/2019 | Mileski et al. | |
| 10,241,177 B2 | 3/2019 | Poole et al. | |
| 10,274,561 B2 | 4/2019 | Poole et al. | |
| 10,281,540 B2 | 5/2019 | Mileski et al. | |
| 10,281,541 B2 | 5/2019 | Poole et al. | |
| 10,295,628 B2 | 5/2019 | Mileski et al. | |
| 10,310,037 B2 | 6/2019 | McNulty et al. | |
| 10,324,147 B2 | 6/2019 | McNulty et al. | |
| 10,330,755 B2 | 6/2019 | Poole et al. | |
| 10,353,030 B2 | 7/2019 | Poole et al. | |
| 10,371,773 B2 | 8/2019 | Poole et al. | |
| 10,379,186 B2 | 8/2019 | Rothberg et al. | |
| 10,416,264 B2 | 9/2019 | Sofka et al. | |
| 10,444,310 B2 | 10/2019 | Poole et al. | |
| 10,466,327 B2 | 11/2019 | Rothberg et al. | |
| 10,488,482 B2 | 11/2019 | Rearick et al. | |
| 10,495,712 B2 | 12/2019 | Rothberg et al. | |
| 10,520,566 B2 | 12/2019 | Poole et al. | |
| 10,527,692 B2 | 1/2020 | McNulty et al. | |
| 10,534,058 B2 | 1/2020 | Sofka et al. | |
| 10,539,637 B2 | 1/2020 | Poole et al. | |
| 10,545,207 B2 | 1/2020 | Poole et al. | |
| 10,551,452 B2 | 2/2020 | Rearick et al. | |
| 10,564,239 B2 | 2/2020 | Poole et al. | |
| 10,591,561 B2 | 3/2020 | Sacolick et al. | |
| 2002/0145424 A1 | 10/2002 | Uetake | |
| 2003/0020553 A1 | 1/2003 | Gao et al. | |
| 2003/0119677 A1 * | 6/2003 | Qiyan | H01P 7/088 |
| | | | 505/210 |
| 2004/0024301 A1 | 2/2004 | Hockett et al. | |
| 2004/0095139 A1 * | 5/2004 | Brown | G01R 33/3415 |
| | | | 324/309 |
| 2005/0033156 A1 | 2/2005 | Kruger et al. | |
| 2005/0245810 A1 | 11/2005 | Khamene et al. | |
| 2005/0270025 A1 | 12/2005 | Nozaki et al. | |
| 2007/0085544 A1 * | 4/2007 | Viswanathan | B82Y 10/00 |
| | | | 324/318 |
| 2007/0279060 A1 | 12/2007 | Dannels et al. | |
| 2007/0293753 A1 * | 12/2007 | El-Sharkawy | G01K 11/006 |
| | | | 600/412 |
| 2008/0231269 A1 | 9/2008 | Ookawa | |
| 2008/0297153 A1 | 12/2008 | Nozaki | |
| 2008/0315879 A1 * | 12/2008 | Saha | A61B 5/055 |
| | | | 324/318 |
| 2009/0093709 A1 * | 4/2009 | Patel | G01R 33/5611 |
| | | | 600/411 |
| 2009/0136104 A1 * | 5/2009 | Hajian | G01R 33/56 |
| | | | 382/128 |
| 2009/0140738 A1 * | 6/2009 | Desvaux | G01R 33/3628 |
| | | | 324/313 |
| 2009/0160442 A1 | 6/2009 | Mazurkewitz et al. | |
| 2010/0019766 A1 | 1/2010 | Zuehlsdorff et al. | |
| 2010/0090697 A1 | 4/2010 | Savukov et al. | |
| 2010/0253331 A1 * | 10/2010 | Griswold | G01R 33/3692 |
| | | | 324/307 |
| 2010/0256477 A1 | 10/2010 | Harvey et al. | |
| 2010/0256481 A1 * | 10/2010 | Mareci | G01R 33/3692 |
| | | | 600/423 |
| 2010/0259259 A1 | 10/2010 | Zahn et al. | |
| 2011/0169489 A1 | 7/2011 | Leussler | |
| 2012/0032678 A1 | 2/2012 | Vaughan, Jr. et al. | |
| 2012/0105064 A1 | 5/2012 | Kumar et al. | |
| 2012/0223709 A1 | 9/2012 | Schillak et al. | |
| 2012/0268116 A1 | 10/2012 | Zhu et al. | |
| 2012/0268132 A1 | 10/2012 | Zhu et al. | |
| 2013/0082704 A1 | 4/2013 | Grodzki | |
| 2013/0113484 A1 * | 5/2013 | Kumar | G01R 33/3628 |
| | | | 324/318 |
| 2013/0154642 A1 | 6/2013 | Sueoka | |
| 2013/0184566 A1 * | 7/2013 | Kreischer | G01R 33/34084 |
| | | | 600/422 |
| 2013/0214785 A1 * | 8/2013 | Shirai | G01R 33/4828 |
| | | | 324/322 |
| 2013/0285659 A1 | 10/2013 | Sohn et al. | |
| 2013/0300417 A1 * | 11/2013 | Malaney | G01R 33/28 |
| | | | 324/314 |
| 2014/0011217 A1 | 1/2014 | Weissleder et al. | |
| 2014/0132267 A1 * | 5/2014 | Wedan | G01R 33/36 |
| | | | 324/318 |
| 2014/0155732 A1 * | 6/2014 | Patz | A61G 11/00 |
| | | | 600/410 |
| 2014/0296695 A1 | 10/2014 | He | |
| 2015/0002156 A1 | 1/2015 | Leussler et al. | |
| 2015/0226822 A1 | 8/2015 | Campagna | |
| 2015/0309138 A1 | 10/2015 | Lee | |
| 2015/0346295 A1 | 12/2015 | Reykowski | |
| 2015/0372395 A1 | 12/2015 | Lavedas | |
| 2016/0069968 A1 | 3/2016 | Rothberg et al. | |
| 2016/0069970 A1 | 3/2016 | Rearick et al. | |
| 2016/0069971 A1 | 3/2016 | McNulty et al. | |
| 2016/0069972 A1 | 3/2016 | Poole et al. | |
| 2016/0069975 A1 | 3/2016 | Rothberg et al. | |
| 2016/0077169 A1 | 3/2016 | Cohen et al. | |
| 2016/0128592 A1 | 5/2016 | Rosen et al. | |
| 2016/0131727 A1 | 5/2016 | Sacolick et al. | |
| 2016/0135711 A1 | 5/2016 | Dohata et al. | |
| 2016/0169992 A1 | 6/2016 | Rothberg et al. | |
| 2016/0169993 A1 | 6/2016 | Rearick et al. | |
| 2016/0223631 A1 | 8/2016 | Poole et al. | |
| 2016/0231399 A1 | 8/2016 | Rothberg et al. | |
| 2016/0231402 A1 | 8/2016 | Rothberg et al. | |
| 2016/0231403 A1 | 8/2016 | Rothberg et al. | |
| 2016/0231404 A1 | 8/2016 | Rothberg et al. | |
| 2016/0299203 A1 | 10/2016 | Mileski et al. | |
| 2016/0334479 A1 | 11/2016 | Poole et al. | |

(56) References Cited

U.S. PATENT DOCUMENTS

| | | |
|---|---|---|
| 2017/0102443 A1 | 4/2017 | Rearick et al. |
| 2017/0108569 A1* | 4/2017 | Harvey ................ G01R 33/422 |
| 2017/0227616 A1 | 8/2017 | Poole et al. |
| 2017/0276747 A1 | 9/2017 | Hugon et al. |
| 2017/0276749 A1 | 9/2017 | Hugon et al. |
| 2017/0299670 A1 | 10/2017 | Tramm et al. |
| 2017/0325710 A1 | 11/2017 | Ryan et al. |
| 2018/0024208 A1 | 1/2018 | Rothberg et al. |
| 2018/0038931 A1 | 2/2018 | Rearick et al. |
| 2018/0088193 A1 | 3/2018 | Rearick et al. |
| 2018/0143274 A1 | 5/2018 | Poole et al. |
| 2018/0143275 A1 | 5/2018 | Sofka et al. |
| 2018/0143280 A1 | 5/2018 | Dyvorne et al. |
| 2018/0143281 A1 | 5/2018 | Sofka et al. |
| 2018/0143283 A1* | 5/2018 | Lips .................... G01R 33/5608 |
| 2018/0144467 A1 | 5/2018 | Sofka et al. |
| 2018/0156881 A1 | 6/2018 | Poole et al. |
| 2018/0164390 A1 | 6/2018 | Poole et al. |
| 2018/0168527 A1 | 6/2018 | Poole et al. |
| 2018/0210047 A1 | 7/2018 | Poole et al. |
| 2018/0224512 A1 | 8/2018 | Poole et al. |
| 2018/0238976 A1* | 8/2018 | Miljak ................ G01R 33/3607 |
| 2018/0238978 A1 | 8/2018 | McNulty et al. |
| 2018/0238980 A1 | 8/2018 | Poole et al. |
| 2018/0238981 A1 | 8/2018 | Poole et al. |
| 2019/0004130 A1 | 1/2019 | Poole et al. |
| 2019/0011510 A1 | 1/2019 | Hugon et al. |
| 2019/0011513 A1 | 1/2019 | Poole et al. |
| 2019/0011514 A1 | 1/2019 | Poole et al. |
| 2019/0011521 A1 | 1/2019 | Sofka et al. |
| 2019/0018094 A1 | 1/2019 | Mileski et al. |
| 2019/0018095 A1 | 1/2019 | Mileski et al. |
| 2019/0018096 A1 | 1/2019 | Poole et al. |
| 2019/0025389 A1 | 1/2019 | McNulty et al. |
| 2019/0033402 A1 | 1/2019 | McNulty et al. |
| 2019/0033414 A1 | 1/2019 | Sofka et al. |
| 2019/0033415 A1 | 1/2019 | Sofka et al. |
| 2019/0033416 A1 | 1/2019 | Rothberg et al. |
| 2019/0038233 A1 | 2/2019 | Poole et al. |
| 2019/0041476 A1* | 2/2019 | Otake ................ G01R 33/3642 |
| 2019/0086497 A1 | 3/2019 | Rearick et al. |
| 2019/0101607 A1 | 4/2019 | Rothberg et al. |
| 2019/0162806 A1 | 5/2019 | Poole et al. |
| 2019/0178962 A1 | 6/2019 | Poole et al. |
| 2019/0178963 A1 | 6/2019 | Poole et al. |
| 2019/0227136 A1 | 7/2019 | Mileski et al. |
| 2019/0227137 A1 | 7/2019 | Mileski et al. |
| 2019/0250227 A1 | 8/2019 | McNulty et al. |
| 2019/0250228 A1 | 8/2019 | McNulty et al. |
| 2019/0257903 A1 | 8/2019 | Poole et al. |
| 2019/0324098 A1 | 10/2019 | McNulty et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2020/0011952 A1 | 1/2020 | Rothberg et al. |
| 2020/0018806 A1 | 1/2020 | Rothberg et al. |
| 2020/0022611 A1 | 1/2020 | Nelson et al. |
| 2020/0022612 A1 | 1/2020 | McNulty et al. |
| 2020/0022613 A1 | 1/2020 | Nelson et al. |
| 2020/0025846 A1 | 1/2020 | Nelson et al. |
| 2020/0025851 A1 | 1/2020 | Rearick et al. |
| 2020/0033431 A1 | 1/2020 | Schlemper et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |

FOREIGN PATENT DOCUMENTS

| | | |
|---|---|---|
| EP | 0301232 A2 | 2/1989 |
| WO | WO 2015/150236 A1 | 10/2015 |

OTHER PUBLICATIONS

International Search Report and Written Opinion for International Application No. PCT/US2017/054316 dated Jan. 4, 2018.
EP 17857502.3, May 4, 2020, Extended European Search Report.
U.S. Appl. No. 15/720,245, filed Sep. 29, 2017, Rearick et al.
PCT/US2017/054316, Nov. 9, 2017, Invitation to Pay Additional Fees.
PCT/US2017/054316, Jan. 4, 2018, International Search Report and Written Opinion.
Extended European Search Report for European Application No. EP 17857502.3 dated May 4, 2020.
Tadanki et al., Double tuning a single input probe for heteronuclear NMR spectroscopy at low field. Journal of Magnetic Resonance. Oct. 1, 2012;223:64-7.

* cited by examiner

RADIO FREQUENCY COIL TUNING METHODS AND APPARATUS

RELATED APPLICATIONS

This Application claims priority under 35 U.S.C. § 120 and is a Continuation of U.S. application Ser. No. 15/720, 245, filed Sep. 29, 2017, entitled "RADIO FREQUENCY COIL TUNING METHODS AND APPARATUS", which claims priority under 35 U.S.C. § 119(e) to U.S. Provisional Patent Application Ser. No. 62/401,657 filed Sep. 29, 2016 and entitled "Radio Frequency Coil Tuning Methods and Apparatus," each application of which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the realignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is on the order of one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but due to one or more of the limitations discussed above, is not practical or is impossible, as discussed in further detail below.

BRIEF DESCRIPTION OF THE DRAWINGS

Some embodiments comprise a method of automatically tuning a radio frequency coil for use with a magnetic resonance imaging system using a tuning circuit connected to the radio frequency coil, the method comprising determining information indicative of a Larmor frequency of the magnetic resonance imaging system, and using a controller to automatically set at least one value of the tuning circuit to cause the radio frequency coil to resonate at approximately the Larmor frequency based on the determined information.

Some embodiments comprise a tuning system configured to tune a radio frequency coil for use with a magnetic resonance imaging system, the tuning system comprising a tuning circuit including at least one tuning element configured to affect a frequency at which the radio frequency coil resonates, and a controller configured to set at least one value for the tuning element to cause the radio frequency coil to resonate at approximately a Larmor frequency of the magnetic resonance imaging system determined by the tuning system.

Some embodiments comprise a magnetic resonance imaging system, comprising a $B_0$ magnet configured to provide a $B_0$ field, at least one radiofrequency coil, and a tuning system configured to tune the at least one radio frequency coil, the tuning system comprising a tuning circuit including at least one tuning element configured to affect a frequency at which the radio frequency coil resonates, and a controller configured to set at least one value for the tuning element to cause the radio frequency coil to resonate at approximately a Larmor frequency of the magnetic resonance imaging system determined by the tuning system.

BRIEF DESCRIPTION OF THE DRAWINGS

Various aspects and embodiments of the disclosed technology will be described with reference to the following figures. It should be appreciated that the figures are not necessarily drawn to scale. Items appearing in multiple figures are indicated by the same reference number in all the figures in which they appear.

Figure 1:
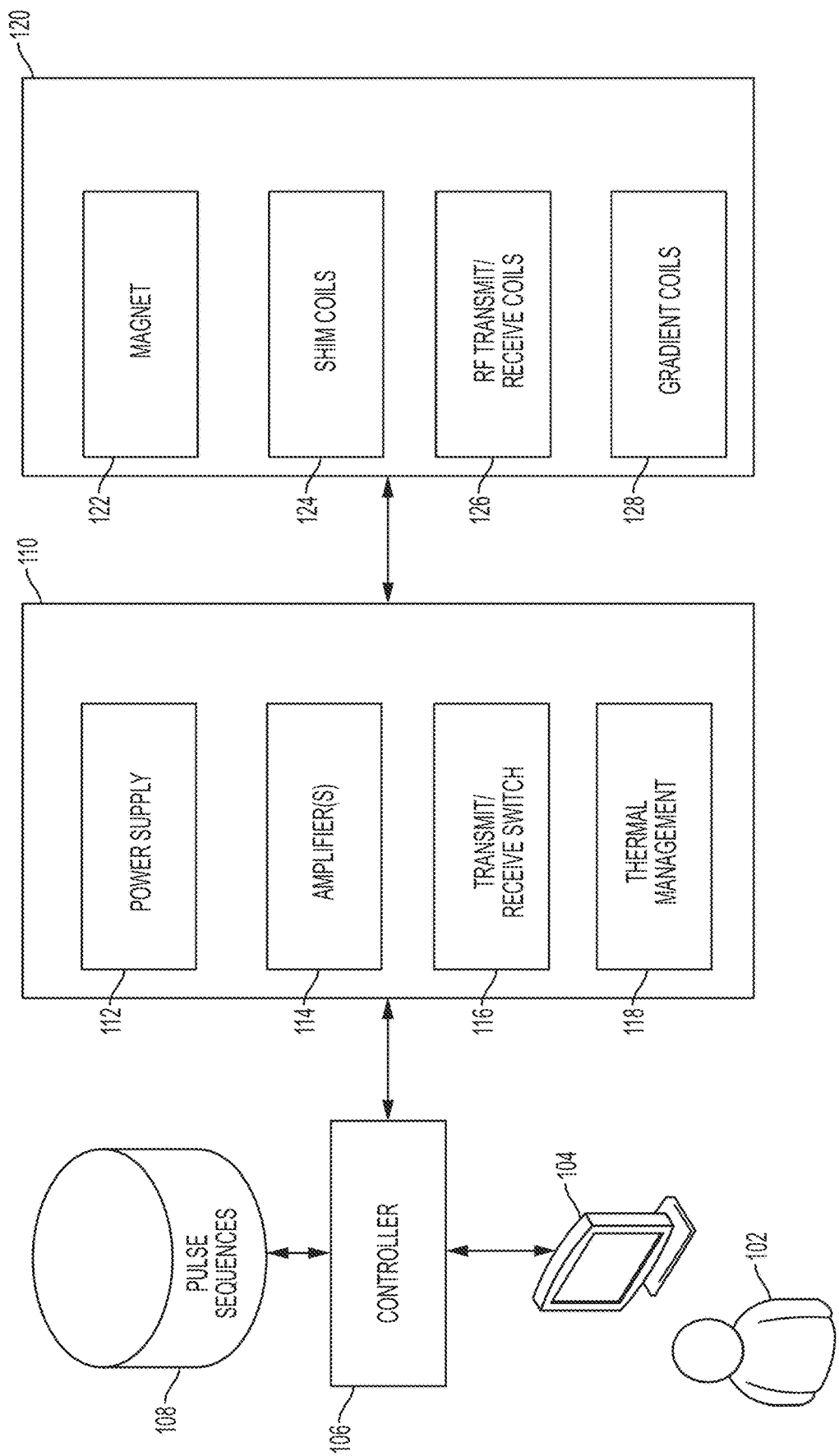
Figure 2:
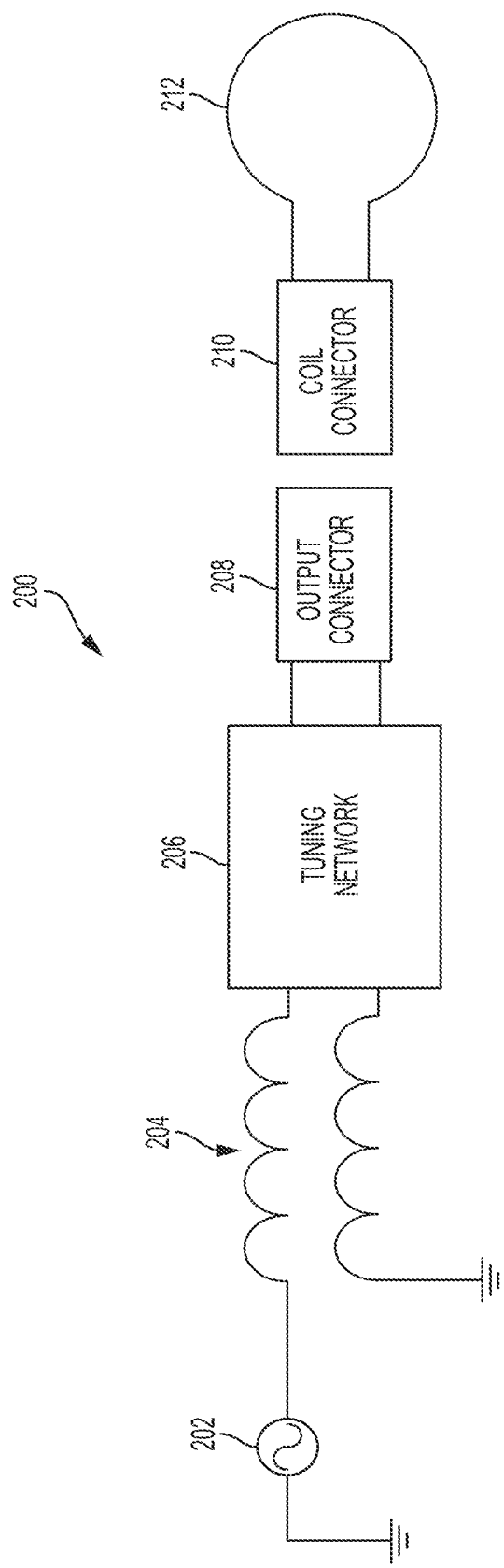
Figure 3:
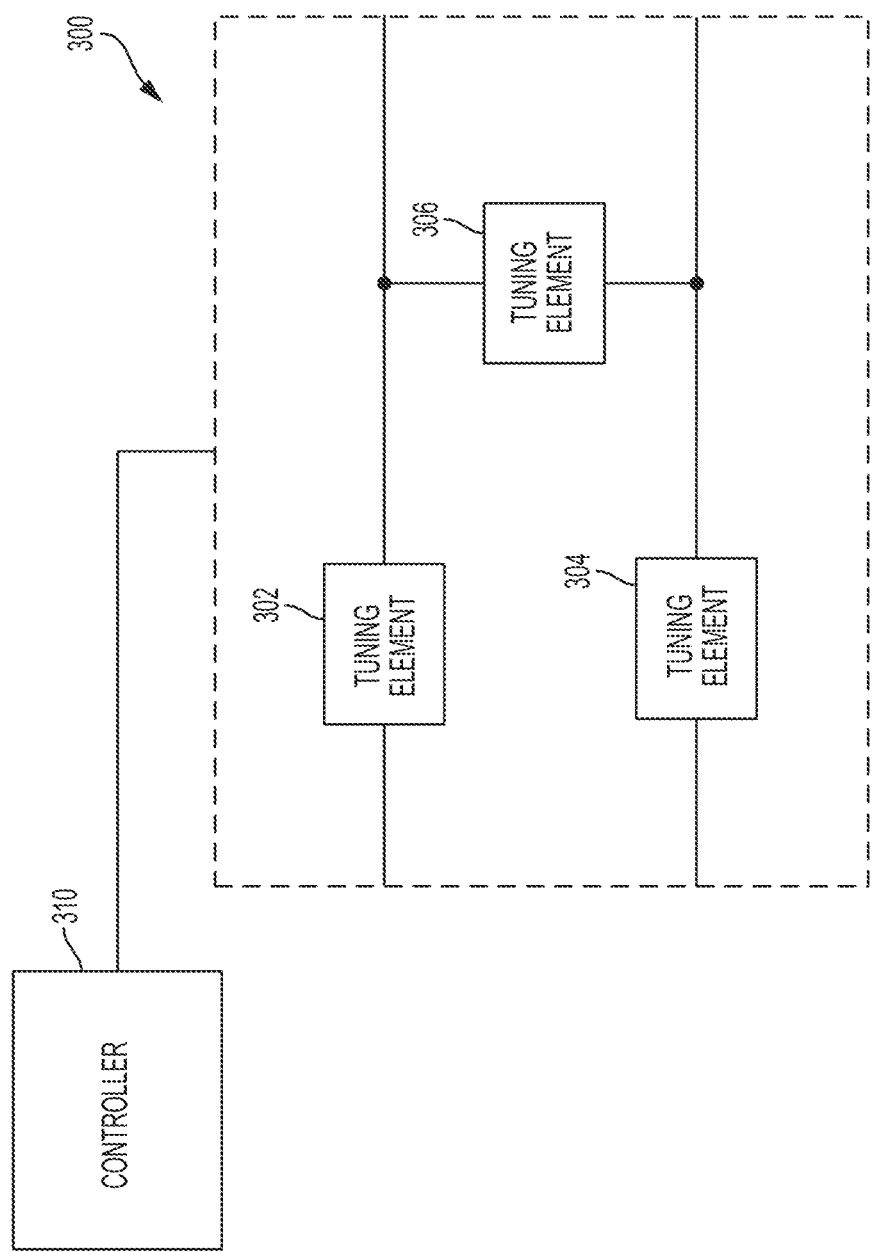
Figure 4:
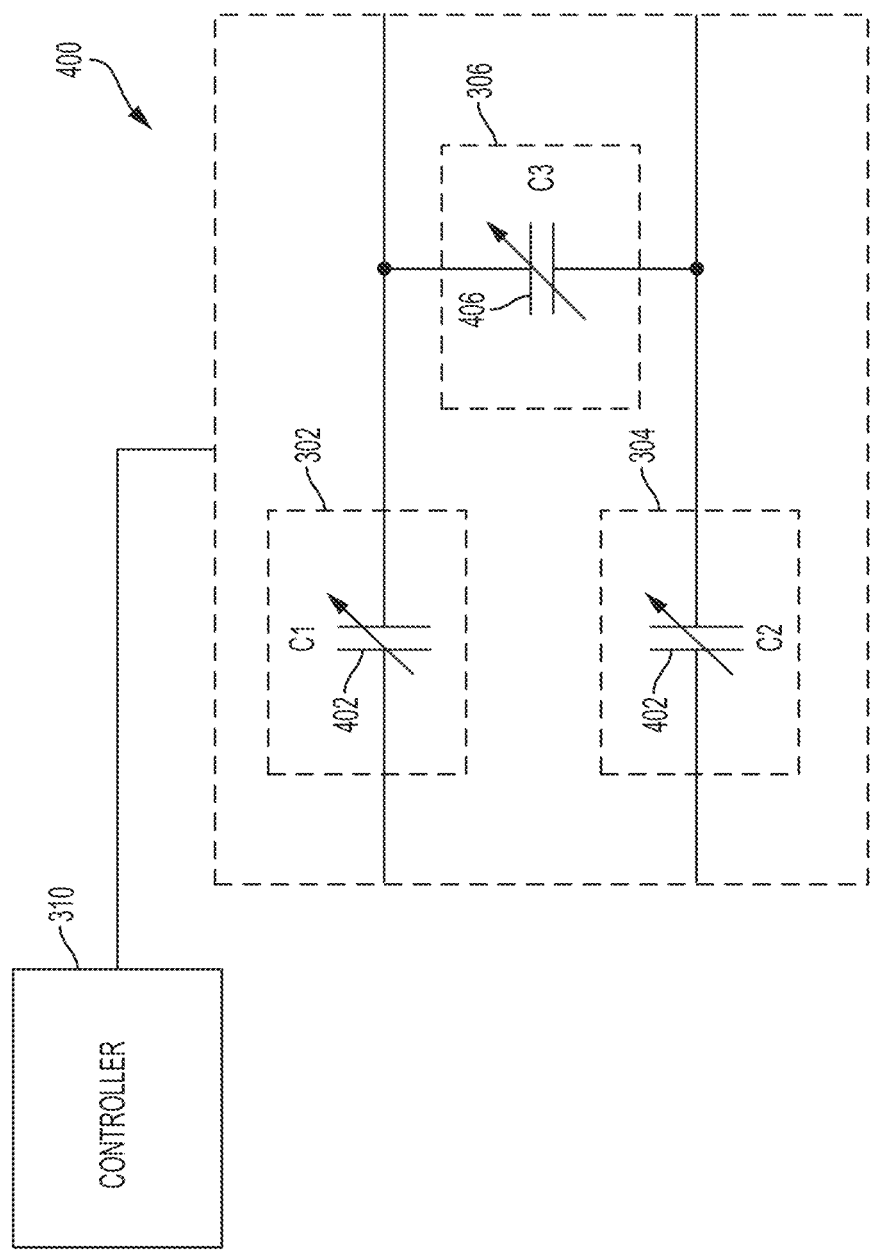
Figure 5:
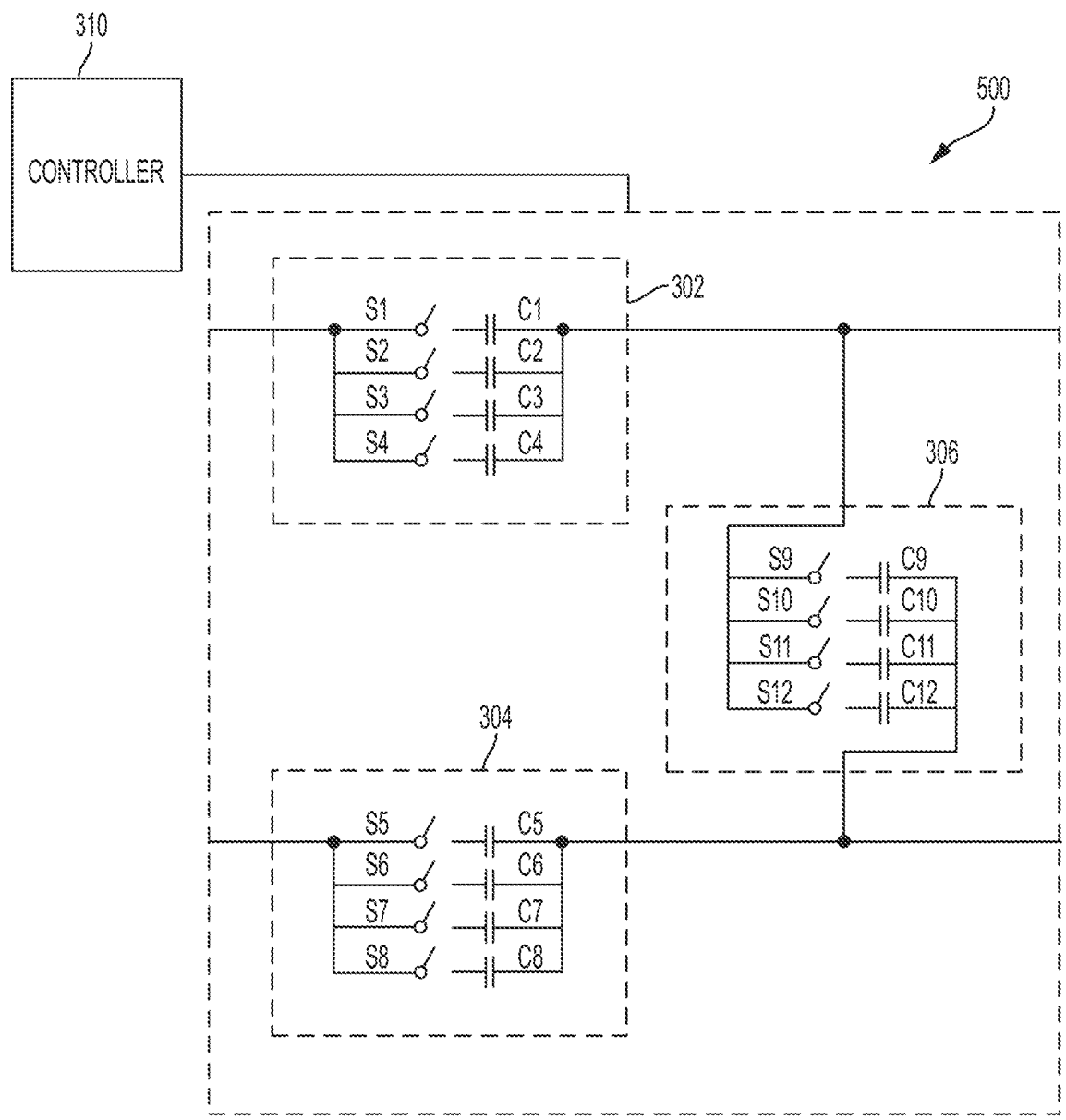
Figure 6:
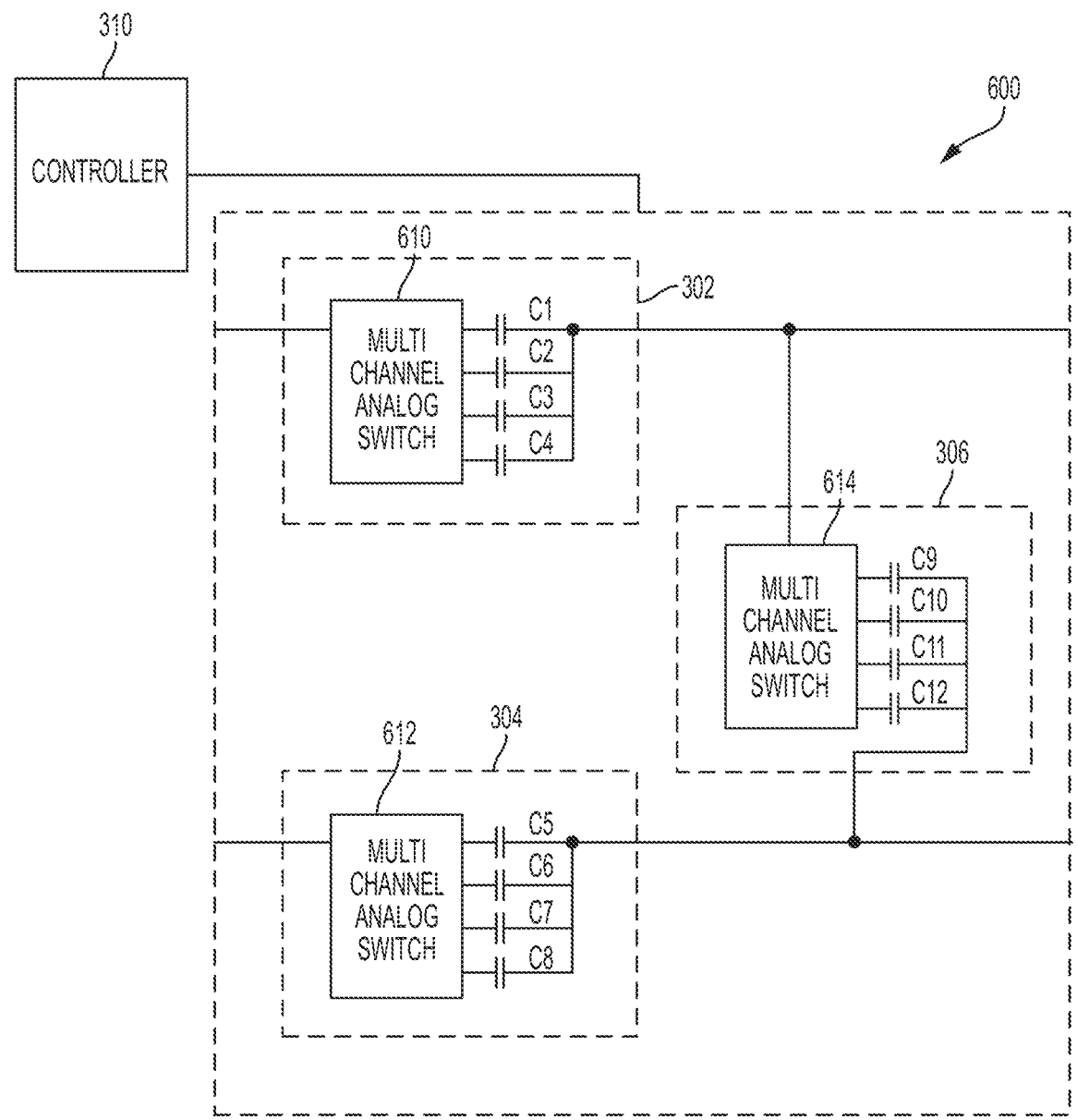
Figure 7:
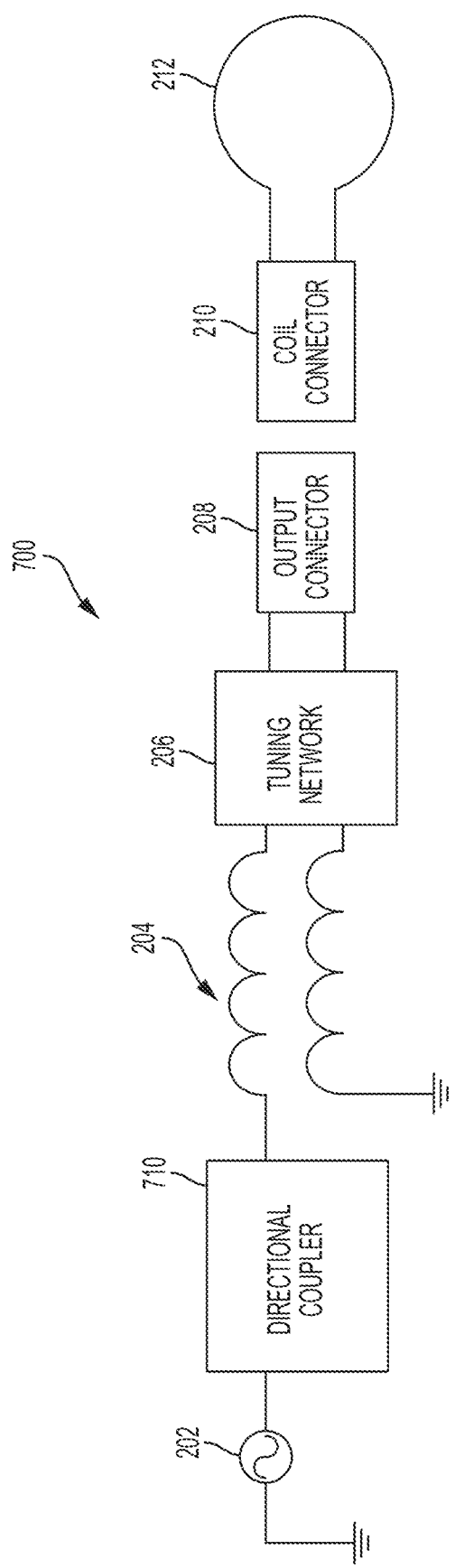
Figure 8:
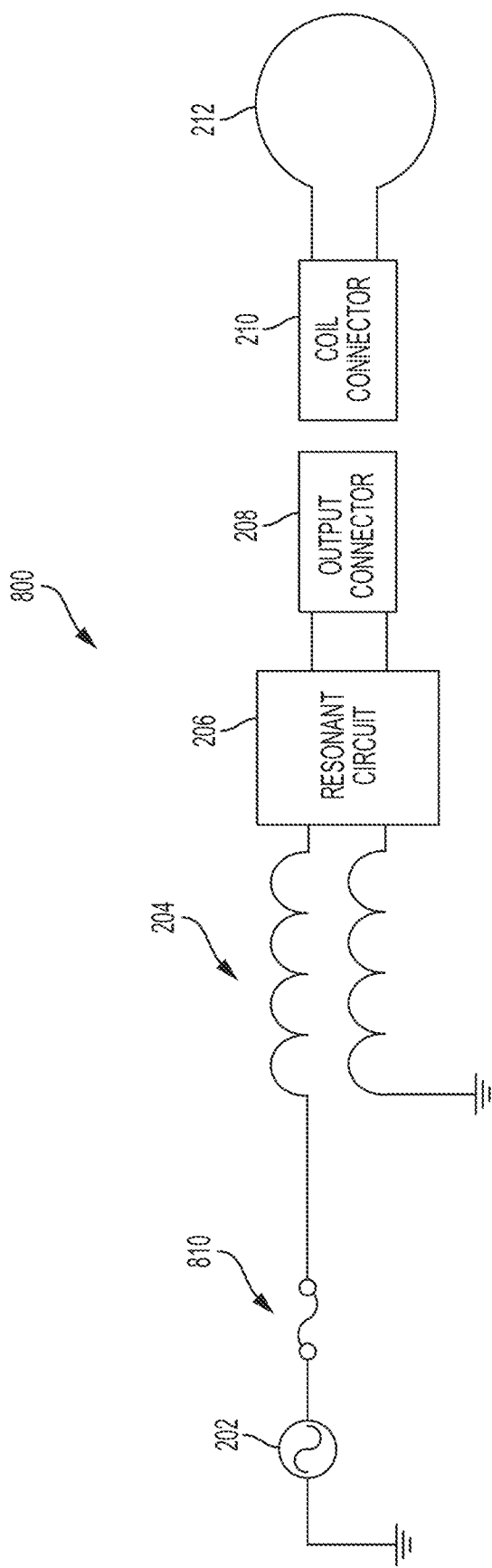
Figure 9:
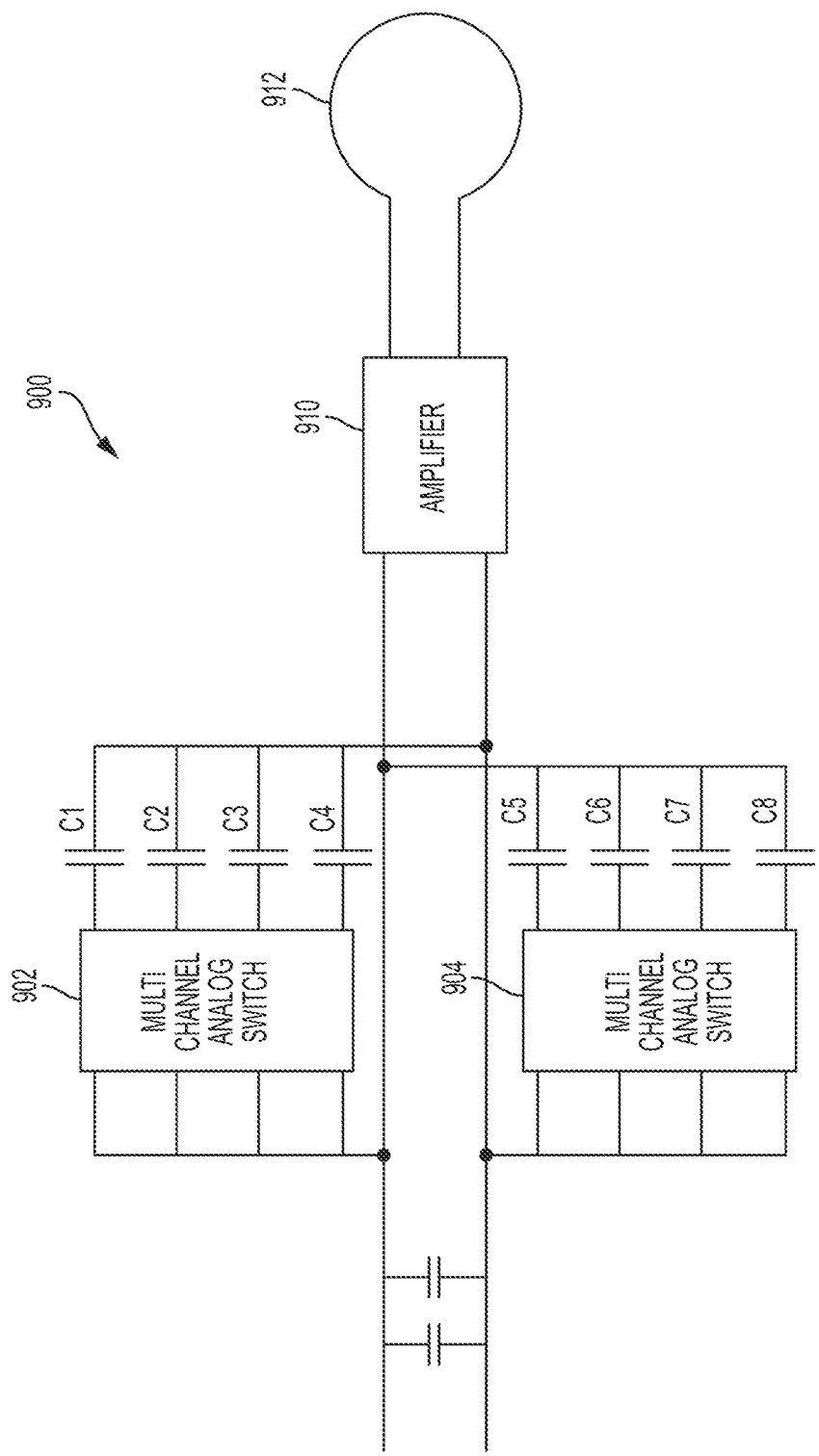
Figure 10A:
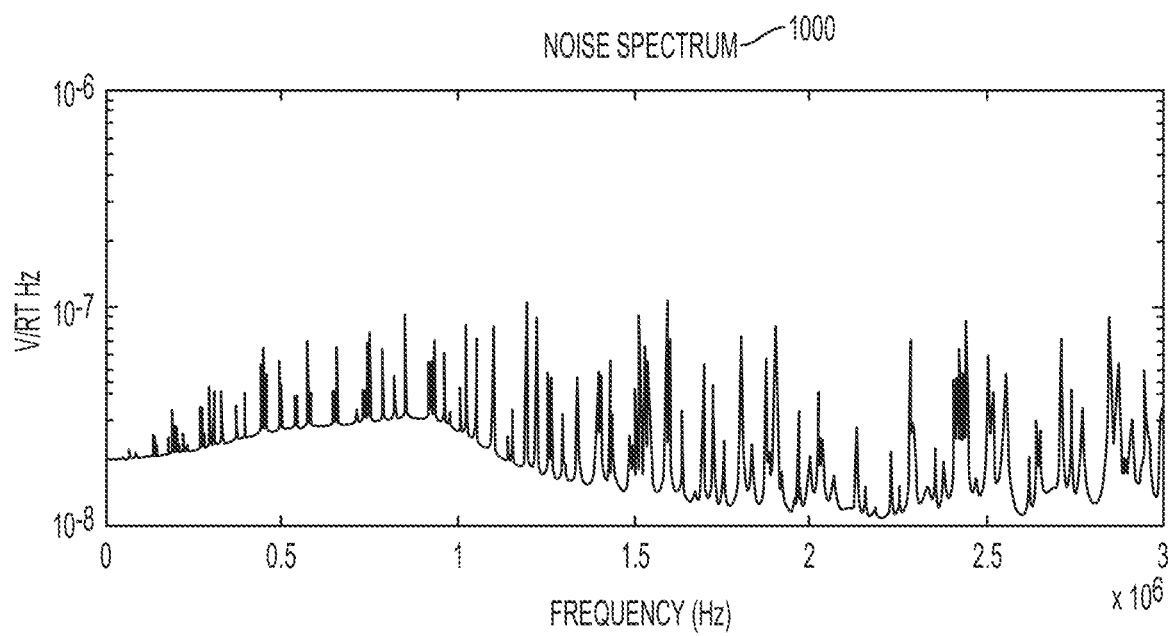
Figure 10B:
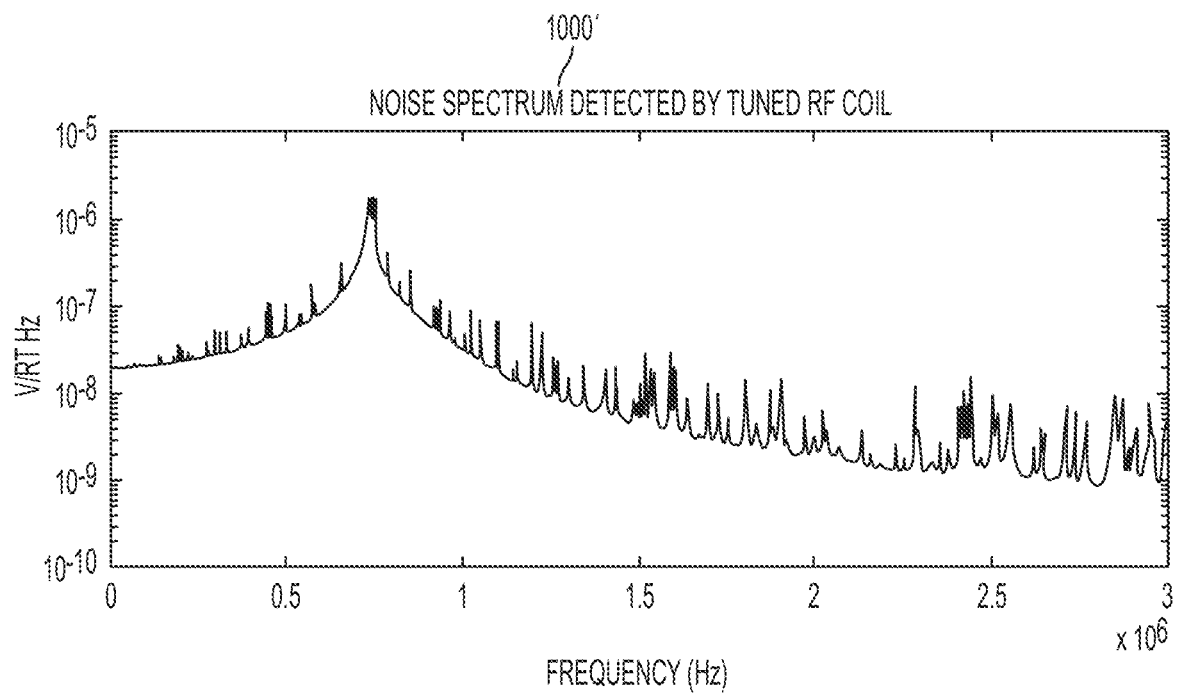
Figure 11:
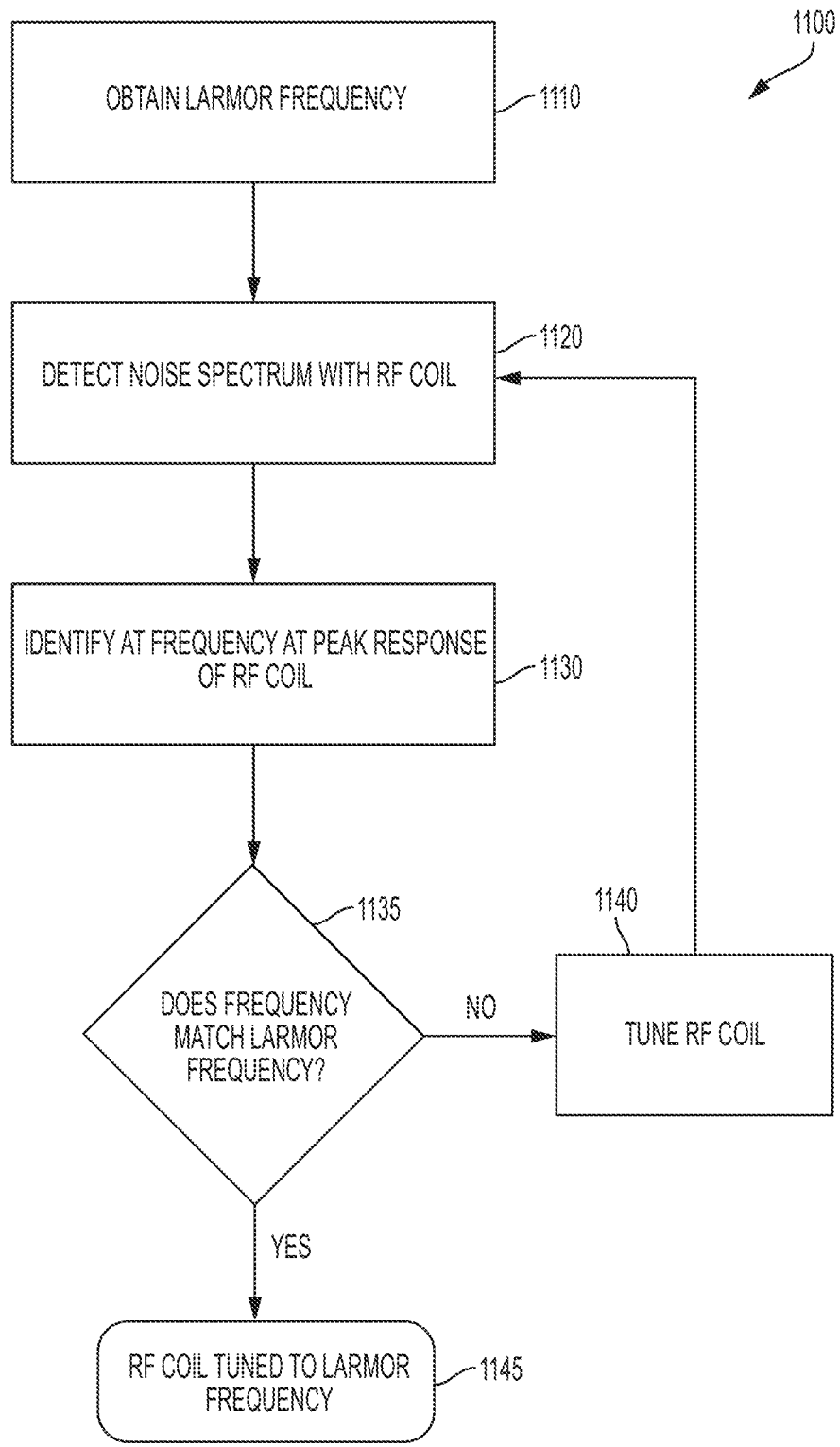
Figures 12A, 12B:
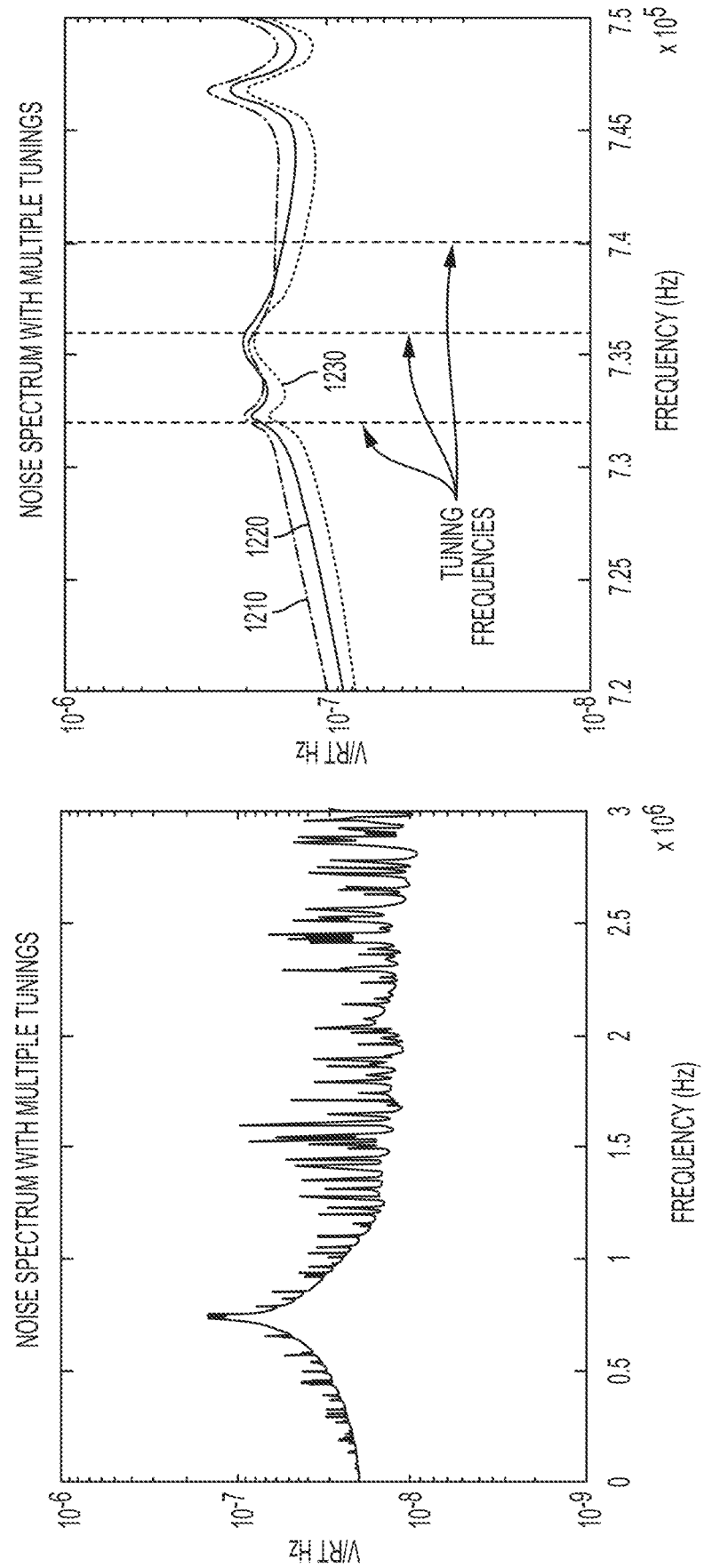
Figure 13:
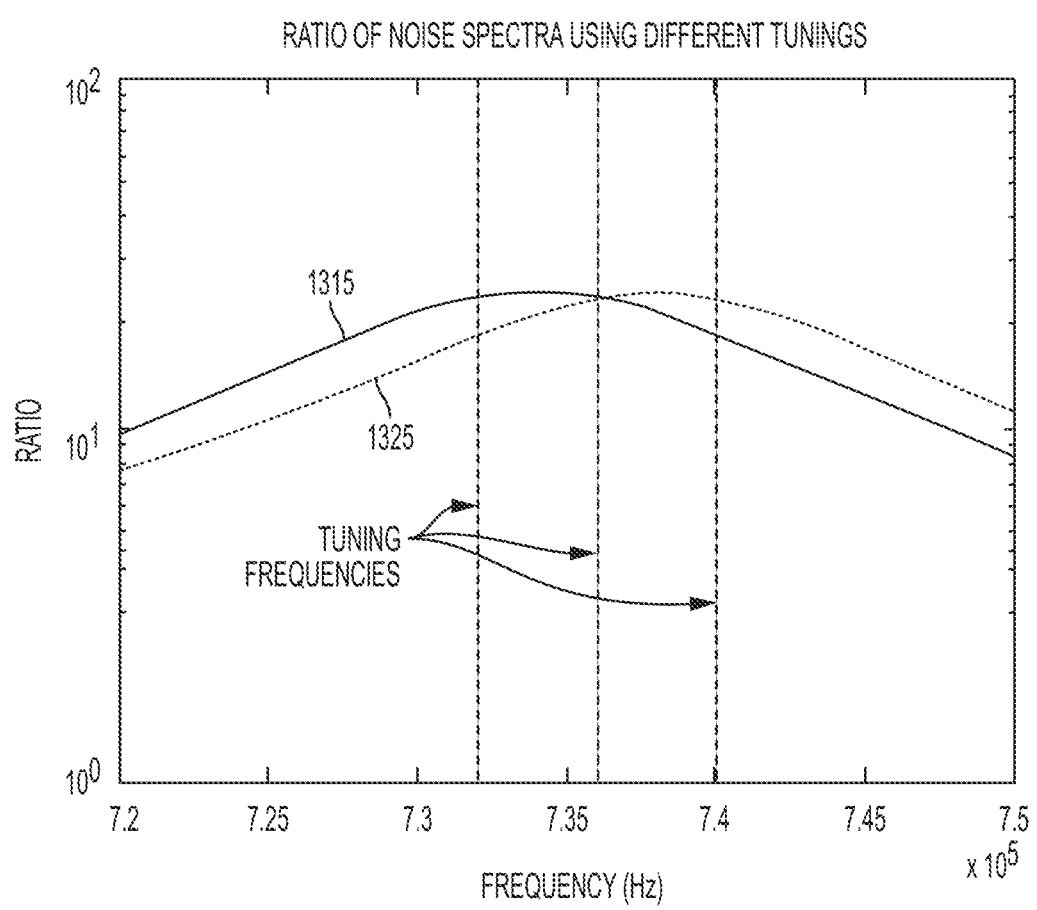
Figure 14:
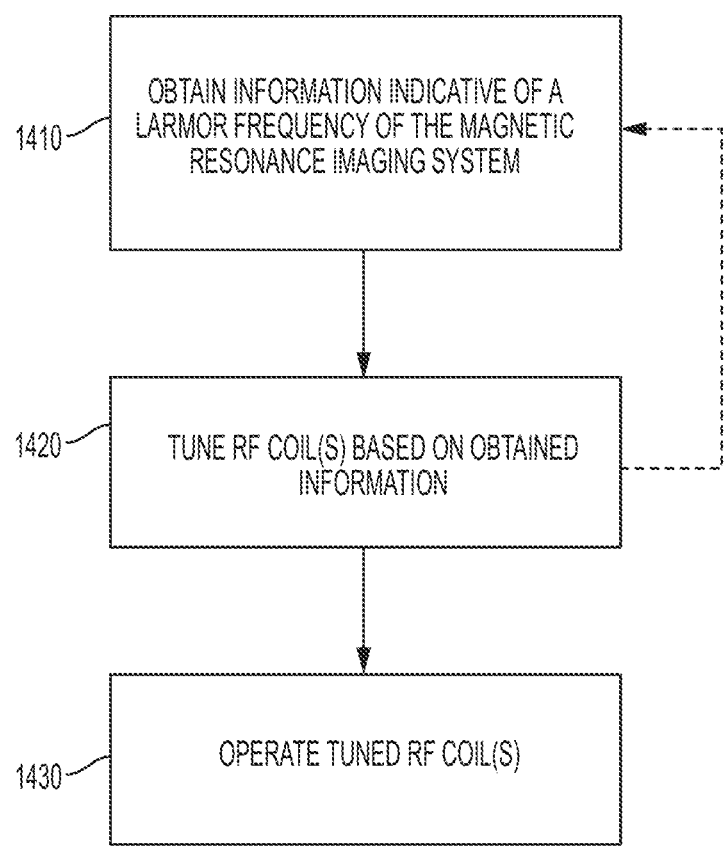
Figure 15:
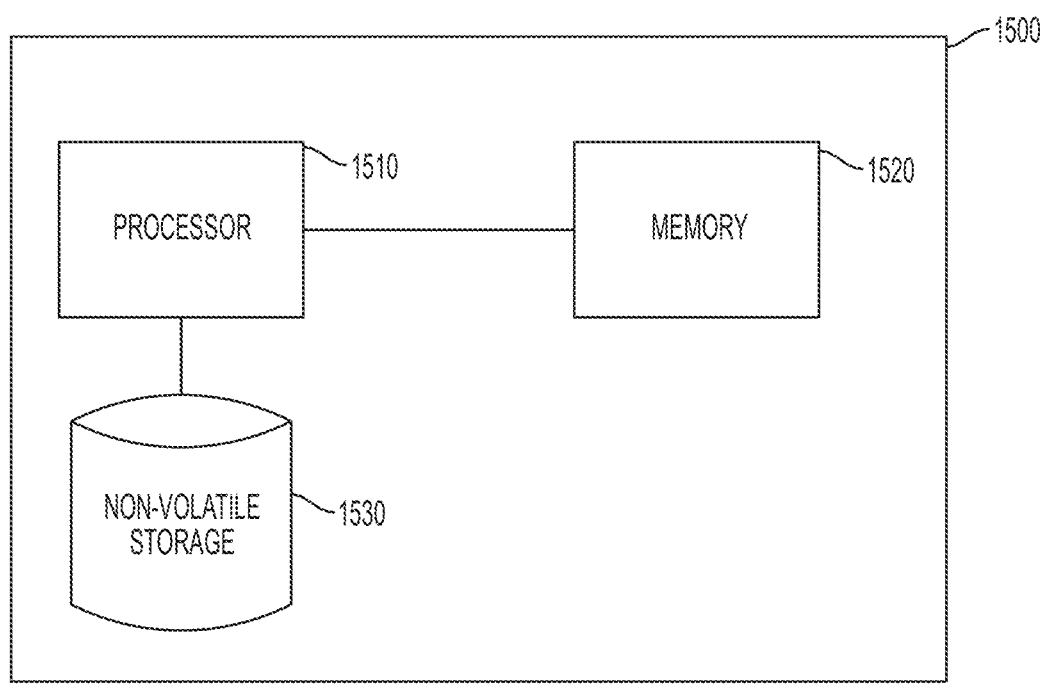

FIG. 1 is a schematic of a low-field MRI system including an RF coil that may be tuned in accordance with some embodiments;

FIG. 2 is a schematic of an RF coil tuning circuit in accordance with some embodiments;

FIG. 3 is a schematic of a tuning network that may be used in the RF coil tuning circuit of FIG. 2 in accordance with some embodiments;

FIG. 4 is a schematic of an implementation of the tuning network of FIG. 3 in accordance with some embodiments;

FIG. 5 is a schematic of an alternate implementation of the tuning network of FIG. 3 in accordance with some embodiments;

FIG. 6 is a schematic of an alternate implementation of the tuning network of FIG. 3 in accordance with some embodiments;

FIG. 7 is a schematic of an alternate RF coil tuning circuit in accordance with some embodiments;

FIG. 8 is a schematic of an alternate RF coil tuning circuit in accordance with some embodiments;

FIG. 9 is a schematic of an alternate RF coil tuning circuit for tuning receive-only RF coils in accordance with some embodiments;

FIG. 10A illustrates an example electromagnetic noise spectrum in the environment of an MRI system;

FIG. 10B illustrates the example electromagnetic noise spectrum illustrated in FIG. 10A as detected by an RF coil, in accordance with some embodiments;

FIG. 11 illustrates a method of tuning a RF coil, in accordance with some embodiments;

FIG. 12A illustrates a noise spectrum detected with an RF coil tuned at multiple frequencies, in accordance with some embodiments;

FIG. 12B illustrates a zoomed in portion of the noise spectrum of FIG. 12A;

FIG. 13 illustrates a differential noise measurement for tuning an RF coil in accordance with some embodiments;

FIG. 14 illustrates a method of tuning a radio frequency coil, in accordance with some embodiments; and FIG. 15 illustrates an exemplary computing device suitable for implementing tuning techniques described herein, for example, as part of a controller.

DETAILED DESCRIPTION

The MRI scanner market is overwhelmingly dominated by high-field systems, and particularly for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 mT are referred to herein as "ultra-low field."

The appeal of high-field MRI systems include improved resolution and/or reduced scan times compared to lower field systems, motivating the push for higher and higher field strengths for clinical and medical MRI applications. However, as discussed above, increasing the field strength of MRI systems yields increasingly more expensive and complex MRI scanners, thus limiting availability and preventing their use as a general purpose and/or generally available imaging solution.

As discussed above, conventional MRI systems require specialized facilities. An electromagnetically shielded room is required for the MRI system to operate and the floor of the room must be structurally reinforced. Additional rooms must be provided for the high-power electronics and the scan technician's control area. Secure access to the site must also be provided. In addition, a dedicated three-phase electrical connection must be installed to provide the power for the electronics that must, in turn, be cooled by a chilled water supply and additional HVAC capacity must be provided. These site requirements are not only costly, but significantly limit the locations where MRI systems can be deployed. Conventional clinical MRI scanners also require substantial expertise to both operate and maintain. These highly trained technicians and service engineers add large on-going operational costs to operating an MRI system. Conventional MRI, as a result, is cost prohibitive and severely limited in accessibility, preventing MRI from being a widely available diagnostic tool capable of delivering a wide range of clinical imaging solutions wherever and whenever needed. Patient must visit one of a limited number of facilities at a time and place scheduled in advance, preventing MRI from being used in numerous medical applications for which it is uniquely efficacious in assisting with diagnosis, surgery, patient monitoring and the like.

As discussed above, high-field MRI systems require specially adapted facilities to accommodate the size, weight, power consumption and shielding requirements of these systems. For example, a 1.5 T MRI system typically weighs between 4-10 tons and a 3 T MRI system typically weighs between 8-20 tons. In addition, high-field MRI systems generally require significant amounts of heavy and expensive shielding. Many mid-field scanners are even heavier, weighing between 10-20 tons due, in part, to the use of very large permanent magnets and/or yokes. Commercially available low-field MRI systems (e.g., operating with a $B_0$ magnetic field of 0.2 T) are also typically in the range of 10 tons or more due the large of amounts of ferromagnetic material used to generate the $B_0$ field, with additional tonnage in shielding. To accommodate this heavy equipment, rooms (which typically have a minimum size of 30-50 square meters) have to be built with reinforced flooring (e.g., concrete flooring), and must be specially shielded to prevent electromagnetic radiation from interfering with operation of the MRI system. Thus, available clinical MRI systems are immobile and require the significant expense of a large, dedicated space within a hospital or facility, and in addition to the considerable costs of preparing the space for operation, require further additional on-going costs in expertise in operating and maintaining the system.

Accordingly, the many requirements of high-field MRI render installations prohibitive in many situations, limiting their deployment to large institutional hospitals or specialized facilities and generally restricting their use to tightly scheduled appointments, requiring the patient to visit dedicated facilities at times scheduled in advance. Thus, the many restrictions on high field MRI prevent MRI from being fully utilized as an imaging modality. Despite the drawbacks of high-field MRI mentioned above, the appeal of the significant increase in SNR at higher fields continues to drive the industry to higher and higher field strengths for use in clinical and medical MRI applications, further increasing the cost and complexity of MRI scanners, and further limiting their availability and preventing their use as a general-purpose and/or generally-available imaging solution.

The low SNR of MR signals produced in the low-field regime (particularly in the very low-field regime) has prevented the development of a relatively low cost, low power and/or portable MRI system. Conventional "low-field" MRI systems operate at the high end of what is typically characterized as the low-field range (e.g., clinically available low-field systems have a floor of approximately 0.2 T) to achieve useful images. Though somewhat less expensive then high-field MRI systems, conventional low-field MRI systems share many of the same drawbacks. In particular, conventional low-field MRI systems are large, fixed and immobile installments, consume substantial power (requiring dedicated three-phase power hook-ups) and require specially shielded rooms and large dedicated spaces. The challenges of low-field MRI have prevented the development of relatively low cost, low power and/or portable MRI systems that can produce useful images.

The inventors have developed techniques enabling portable, low-field, low power and/or lower-cost MRI systems that can improve the wide-scale deployability of MRI technology in a variety of environments beyond the current MRI installments at hospitals and research facilities. As a result, MRI can be deployed in emergency rooms, small clinics, doctor's offices, in mobile units, in the field, etc. and may be brought to the patient (e.g., bedside) to perform a wide variety of imaging procedures and protocols. Some embodiments include very low-field MRI systems (e.g., 0.1 T, 50 mT, 20 mT, etc.) that facilitate portable, low-cost, low-power MRI, significantly increasing the availability of MRI in a clinical setting.

According to some embodiments, tuning techniques described herein facilitate automatic tuning of RF coils with greater precision, improving the SNR of MR signal acquisition, thus facilitating improved low-field MRI. According to some embodiments, tuning techniques described herein allow for RF coil(s) to be tuned to the actual operating conditions of the MRI system (e.g., RF coil(s) tuned to match the Larmor frequency resulting from the actual $B_0$ magnetic field currently produced by the $B_0$ magnet of the MRI system), thereby generally optimizing SNR in this respect. According to some embodiments, tuning techniques describe herein facilitate automatic tuning of RF coils to operate with MRI systems having different $B_0$ magnetic field strengths and/or to operate with an MRI system that is configurable to operate at different $B_0$ magnetic field strengths.

FIG. 1 is a block diagram of exemplary components of a low-field MRI system. In the illustrative example of FIG. 1, low-field MRI system comprises workstation 104, controller 106, pulse sequences repository 108, power management system 110, and magnetics components 120. It should be appreciated that the low-field MRI system of FIG. 1 is illustrative and that a low-field MRI system may have one or more other components of any suitable type in addition to or instead of the components illustrated in FIG. 1.

As illustrated in FIG. 1, magnetics components 120 comprises magnet 122, shim coils 124, RF transmit/receive coils 126, and gradient coils 128. Magnet 122 may be used to generate the main magnetic field $B_0$. Magnet 122 may be any suitable type of magnet that can generate a main magnetic field having low-field strength (i.e., a magnetic field having a strength of 0.2 Tesla or less). Shim coils 124 may be used to contribute magnetic field(s) to improve the homogeneity of the $B_0$ field generated by magnet 122.

Gradient coils 128 may be arranged to provide gradient fields and, for example, may be arranged to generate gradients in the magnetic field in three substantially orthogonal directions (X, Y, Z).

RF transmit/receive coils 126 comprise one or more transmit coils that may be used to generate RF pulses to induce an oscillating magnetic field $B_1$. The transmit coil(s) may be configured to generate any suitable types of RF pulses useful for performing low-field MR imaging.

Each of magnetics components 120 may be constructed in any suitable way. For example, in some embodiments, one or more (e.g., all) of magnetics components 120 may be fabricated using the laminate techniques described in U.S. Provisional Patent Application Ser. No. 62/046,814, titled "Low-field Magnetic Resonance Imaging Methods and Apparatus," and filed Sep. 5, 2014, which is herein incorporated by reference in its entirety.

Power management system 110 includes electronics to provide operating power to one or more components of the low-field MRI system. For example, as discussed in more detail below, power management system 110 may include one or more power supplies, gradient power amplifiers, transmit coil amplifiers, and/or any other suitable power electronics needed to provide suitable operating power to energize and operate components of the low-field MRI system.

As illustrated in FIG. 1, power management system 110 comprises power supply 112, amplifier(s) 114, transmit/receive switch 116, and thermal management components 118. Power supply 112 includes electronics to provide operating power to magnetic components 120 of the low-field MRI system. For example, power supply 112 may include electronics to provide operating power to one or more $B_0$ coils (e.g., $B_0$ magnet 122) to produce the main magnetic field for the low-field MRI system. In some embodiments, power supply 112 is a unipolar, continuous wave (CW) power supply, however, any suitable power supply may be used. Transmit/receive switch 116 may be used to select whether RF transmit coils or RF receive coils are being operated.

Amplifier(s) 114 may include one or more RF receive (Rx) pre-amplifiers that amplify MR signals detected by one or more RF receive coils (e.g., coils 124), one or more RF transmit (Tx) amplifiers configured to provide power to one or more RF transmit coils (e.g., coils 126), one or more gradient power amplifiers configured to provide power to one or more gradient coils (e.g., gradient coils 128), shim amplifiers configured to provide power to one or more shim coils (e.g., shim coils 124).

Thermal management components 118 provide cooling for components of low-field MRI system and may be configured to do so by facilitating the transfer of thermal energy generated by one or more components of the low-field MRI system away from those components. Thermal management components 118 may include, without limitation, components to perform water-based or air-based cooling, which may be integrated with or arranged in close proximity to MRI components that generate heat including, but not limited to, $B_0$ coils, gradient coils, shim coils, and/or transmit/receive coils. Thermal management components 118 may include any suitable heat transfer medium including, but not limited to, air and water, to transfer heat away from components of the low-field MRI system.

As illustrated in FIG. 1, low-field MRI system includes controller 106 (also referred to herein as a "console") having control electronics to send instructions to and receive information from power management system 110. Controller 106 may be configured to implement one or more pulse sequences, which are used to determine the instructions sent to power management system 110 to operate one or more of magnetic components 120 in a desired sequence. Controller 106 may be implemented as hardware, software, or any suitable combination of hardware and software, as aspects of the disclosure provided herein are not limited in this respect.

In some embodiments, controller 106 may be configured to implement a pulse sequence by obtaining information about the pulse sequence from pulse sequences repository 108, which stores information for each of one or more pulse sequences. Information stored by pulse sequences repository 108 for a particular pulse sequence may be any suitable information that allows controller 106 to implement the particular pulse sequence. For example, information stored in pulse sequences repository 108 for a pulse sequence may include one or more parameters for operating magnetics components 120 in accordance with the pulse sequence (e.g., parameters for operating the RF transmit/receive coils 126, parameters for operating gradient coils 128, etc.), one or more parameters for operating power management system 110 in accordance with the pulse sequence, one or more programs comprising instructions that, when executed by controller 106, cause controller 106 to control system 100 to operate in accordance with the pulse sequence, and/or any other suitable information. Information stored in pulse sequences repository 108 may be stored on one or more non-transitory storage media.

As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 to facilitate the processing of MR data by the computing device. For example, controller 106 may provide information about one or more pulse sequences to computing device 104 and the computing device may perform an image reconstruction process based, at least in part, on the provided information.

Computing device 104 may be any electronic device configured to process acquired MR data and generate one or more images of a subject being imaged. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, computing device 104 may be a portable device such as a smart phone, a personal digital assistant, a laptop computer, a tablet computer, or any other portable device that may be configured to process MR data and generate one or images of the subject being imaged. In some embodiments, computing device 104 may comprise multiple computing devices of any suitable type, as aspects of the disclosure provided herein are not limited in this respect. A user 102 may interact with computing device 104 to control aspects of the low-field MR system (e.g., program the system to operate in accordance with a particular pulse sequence, adjust one or more parameters of the system, etc.) and/or view images obtained by the low-field MR system.

Briefly, MRI involves placing an object (e.g., all or a portion of a patient) to be imaged in a static, homogenous magnetic field $B_0$ to align atomic spins of atoms in the direction of the $B_0$ field. For high-field MRI systems, superconducting magnets made from coils of superconducting wire are generally required to achieve the homogeneity of $B_0$ at field strengths employed in high-field MRI. Not only are the superconducting magnets themselves costly, but they generally require cryogenic cooling during operation, increasing the cost and complexity of high-field MRI scanners. In addition to the $B_0$ magnetic component, gradient coils are provided to spatially encode MR signals from the object, and transmit and receive coils are provided to generate a magnetic field $B_1$ at a frequency related to the field strength of the magnetic field $B_0$ to cause atomic spins to change orientation and to detect MR signals emitted from the object upon realignment of the atomic spins with the magnetic field $B_0$, respectively. At high-field strengths and the associated high frequencies, these magnetic components are also relatively complex and expensive.

As discussed above, MRI systems stimulate and detect emitted MR signals using transmit and receive coils (e.g., RF Tx/Rx coils 126), respectively (often referred to as radio frequency (RF) coils). The configuration of the transmit/receive coils varies with implementation and may include a single coil for both transmitting and receiving, separate coils for transmitting and receiving, multiple coils for transmitting and/or receiving, or any combination to achieve single channel or parallel MRI systems. Thus, the transmit/receive magnetic component is often referred to as Tx/Rx or Tx/Rx coils to generically refer to the various configurations for the transmit and receive component of an MRI system.

RF coils configured as transmit coils generate a magnetic field $B_1$ at a particular frequency related to the field strength of the magnetic field $B_0$. Additionally, receive coils are configured to receive MR signals at the particular frequency. To operate optimally, RF coils (e.g., Tx only, Rx only or Tx/Rx) are often tuned to resonate as close as possible to a particular frequency called the Larmor frequency. The Larmor frequency (w) is related to the strength of the $B_0$ field in accordance with following relation: $\omega = \gamma B$, where $\gamma$ is the gyromagnetic ratio of the imaged isotope (e.g., $^1H$) in MHz/T, and B is the strength of the $B_0$ field in unit of Tesla. Examples of commonly used Larmor frequencies used in high-field MRI are approximately 64 MHz for a 1.5 T MRI system and approximately 128 MHz for a 3 T MRI system. For low-field MRI systems, the Larmor frequency is substantially lower than for high-field MRI systems. For example, the Larmor frequency for a 6.5 mT MRI system is approximately 277 kHz, the Larmor frequency for a 50 mT MRI system is approximately 2.1 MHz and approximately 4.2 MHz for a 0.1 T MRI system.

Most commercially-available RF coils used with high-field MRI systems are typically tuned by the manufacturer for use with a system having a particular field strength, and such coils frequently provide only limited or no ability for the end user to further tune the RF coil in the field. In practice, precise tuning of most RF coils used to transmit RF energy and/or receive MR signals in high-field MRI systems is usually not necessary due to the strength of the received signal relative to the noise level of the coil introduced by small fluctuations from the optimal tuning of the coil. However, the inventors have recognized and appreciated that RF coils designed for use with a low-field MRI system (e.g., a system producing a $B_0$ field of less than or equal to 0.2 T, 0.1 T, 50 mT, 20 mT, 10 mT, etc.) detect much smaller signals, thereby placing a larger importance on precise tuning of the RF coil. As the field strength is reduced further (e.g., into the very low-field range), the decrease in SNR as a function of field strength becomes increasingly significant, making precise tuning the of the RF coil even more significant.

Additionally, some low-field MRI systems, that may be used in accordance with some embodiments, provide functionality for changing the strength of the $B_0$ field for different imaging applications and/or to minimize external noise sources. As should be appreciated from the foregoing discussion, changing the $B_0$ field strength changes the Larmor frequency to which the RF coils should be tuned to operate optimally. Accordingly, the RF tuning methods and apparatus described herein may be used to automatically tune an RF coil based on the current $B_0$ field strength of the low-field MRI system. In conventional systems where the RF coil is tuned by the manufacturer, such changes to the $B_0$ field are generally not possible as doing so results in RF coil(s) that are no longer tuned to resonate at the correct frequency.

RF coils may be formed by an inductor capacitor circuit including one or more inductive elements and one or more capacitive elements. The resonant frequency of the RF coils is determined as $$v = \frac{1}{2\pi\sqrt{LC}},$$

where L and C represent the inductance and capacitance of the coil circuit. Accordingly, tuning an RF coil to a particular resonant frequency may be achieved by modifying the inductance and/or the capacitance of the circuit. Some embodiments, discussed in more detail below, tune an RF coil used for low-field MRI by changing the series capacitance of the RF coil.

FIG. 2 illustrates a tuning circuit 200 in accordance with some embodiments that may be used to tune a Tx/Rx RF coil for use in a low-field MRI system. Tuning circuit 200 includes a current source 202 that may be used, in combination with other components of the RF coil, to generate the $B_1$ field during a transmit operation. Any suitable current source 202 may be used, and embodiments are not limited in this respect. For example, in some embodiments, current source 202 comprises a 50Ω coaxial cable connected to a current source such as a signal generator, a network analyzer, or another current source. Tuning circuit 200 also includes balun 204 connected between current source 202 and the input to tuning network 206.

Tuning network 206 includes one or more controllable circuit components that may be configured to tune the resonant frequency of an RF coil. Examples of tuning networks 206 that may be used in accordance with some embodiments are described in more detail below. As shown, tuning circuit 200 also includes output connector 208 configured to connect with coil connector 210 of an RF coil to be tuned using tuning circuit 200. Any suitable output connector 208 and coil connector 210 may be used, and embodiments are not limited in this respect. For example, in some implementations, a three-pin mini-jack connector may be used as the output connector 208, with two of the three pins corresponding to the balanced output from tuner network 206, and the third pin (not shown) being configured to connect to a shield of a balanced shielded line (not shown) in coil connector 210, as discussed in more detail below.

As shown, coil connector 210 is connected to RF coil 212, which, as discussed above, forms an LC circuit that may be tuned in accordance with the techniques described herein. In some embodiments, coil connector 210 may be connected to RF coil 212 using a shielded balanced feed line, and connector 208 may be configured to support a balanced cable connection. RF coil 212 may comprise any suitable type and number of RF coil(s) used for low-field MRI including, but not limited to, one or more head coils, one or more body coils, one or more surface coils, and any combination of the foregoing.

In some embodiments, coil connector 210 may include at least one storage device (e.g., an EEPROM) configured to store information about the coil that may be used to facilitate tuning of the coil when attached to the tuning circuit. For example, the information stored on the at least one storage device may include, but is not limited to, an identifier of the type of coil, and one or more tuning parameters for the coil. When connected to output connector 208, at least some of the information stored on the at least one storage device associated with the coil connector may be transferred to a controller configured to control characteristics of the tuning circuit to tune the connected RF coil.

Tuning circuit 200 includes components configured to tune RF coils having both transmit and receive functionality. Alternatively, tuning circuit 200 may be configured to tune RF coils having only transmit functionality or only receive functionality. When configuring tuning circuit 200 to tune receive-only RF coils, some components of tuning circuit 200 including, but not limited to, current source 202, and one or more components of tuning network 206 may not be needed, to provide a simpler tuning circuit design, as discussed in more detail below.

FIG. 3 illustrates a tuning network 300 that may be used to tune an RF coil in accordance with some embodiments. As shown, tuning network 300 includes a plurality of tuning elements arranged in a balanced configuration that, when adjusted, tune an RF coil connected to tuning circuit 200. As shown, tuning network 300 includes a coupling tuning element 302 arranged between a first input and a first output of tuning network 300 and a coupling tuning element 304 arranged between a second input and a second output of tuning network 300. The value of coupling tuning elements 302 and 304 may be adjusted to improve impedance matching between the tuning circuit and a connected RF coil. Tuning network 300 also includes a resonance tuning element 306 arranged between the first and second outputs of tuning network 300. When tuning circuit 300 is connected to an RF coil, resonance tuning element 306 is arranged in series with the RF coil circuit providing a mechanism for controlling the series capacitance of the coil circuit to tune the coil to a desired frequency.

The inventors have recognized and appreciated that manually setting the values of the tuning elements in tuning network 300 to precise values to provide a desired resonance frequency and impedance matching characteristics for an RF coil is challenging and cumbersome. Accordingly, some embodiments include controller 310, which is configured to automatically adjust the values of one or more of tuning elements 302, 304, and 306 to a desired value based, at least in part, on the $B_0$ field strength of the low-field MRI system, or other suitable parameter(s), to tune the RF circuit. In some embodiments, controller 310 may set the value of one or more of tuning elements 302, 304, 306 based, at least in part, on values stored in a look-up table associated with controller 310. For example, the look-up table may store a correspondence between Larmor frequencies and capacitance values for tuning elements 302, 304, and/or 306. Controller 310 may be configured to set initial values for tuning elements 302, 304, and/or 306 based on the stored values in the look-up table, and the initial values may be adjusted, as discussed in more detail below, until an optimal tuning of the RF coil is reached.

Controller 310 may determine a desired $B_0$ field strength for the low-field MRI system in any suitable way. In some embodiments, information about the $B_0$ field strength may be provided to controller 310 from console 106 associated with the low-field MRI system. In other embodiments, information about the $B_0$ field strength may be provided to controller 310 from coil connector 210 in response to coil connector 210 being connected to output connector 208. For example, as discussed above, coil connector 210 may include an EEPROM or other storage device that stores tuning information for the coil including, but not limited to, $B_0$ field strength information, and the stored tuning information may be transmitted to controller 310 in response to connection of RF coil 212 to the tuning circuit 200. As discussed above, the $B_0$ field strength at which it is desired to operate a low-field MRI system may be variable, for example, to perform Overhauser magnetic resonance imaging (OMRI), to operate the low-field MRI system in a frequency band determined to have sufficiently low electromagnetic interference, or for any other reason. As such, controller 310 may be configured to dynamically determine values of the tuning elements to tune the RF coil to the desired frequency.

The inventors have further appreciated the benefit tuning one or more RF coils based on the actual Larmor frequency and/or actual magnetic field strength of the $B_0$ magnetic field (e.g., the actual $B_0$ field currently produced by the MRI system). In particular, in the low-field regime, deviations between the Larmor frequency and the resonant frequency at which RF coil(s) is/are tuned results in reduced SNR that can significantly impact image acquisition and quality. Accordingly, by determining information indicative of the Larmor frequency at the current $B_0$ magnetic field (e.g., estimating or measuring the actual Larmor frequency), the RF coil(s) can be tuned accordingly to resonate as close to the Larmor frequency as possible, thus improving the SNR of MR signal acquisition. The Larmor frequency may be estimated in a number of ways, including, but not limited to, deriving the Larmor frequency from detected MR signals, deriving the Larmor frequency from noise measurements, measuring the $B_0$ magnetic field, etc., some examples of which are described in further detail below.

The values of each of tuning elements 302, 304, and 306 may be adjusted individually or together, and embodiments are not limited based on the circuit component(s) used to set the values for the tuning elements. In some embodiments, controller 310 obtains information indicative of a Larmor frequency of the MRI system. For example, controller 310 may determine or receive information about a desired $B_0$ magnetic field strength or may receive information associated with the current $B_0$ field strength (e.g., from console 106, coil connector 210, one or more MR measurements, one or more sensors measuring the current $B_0$ field strength, or any other suitable source) and sends control instructions to adjust the values of one or more of tuning elements 302, 304, and/or 306 to tune a connected RF coil to a resonance frequency close to the Larmor frequency associated with the desired or the current $B_0$ field strength.

Although only three tuning elements are illustrated in the tuning network 300 shown in FIG. 3, it should be appreciated that more or fewer tuning elements may alternatively be used, and the circuit configuration shown in FIG. 3 is merely one example of a suitable configuration. For example, when used to tune a receive only RF coil, only a single tuning element (e.g., tuning element 306) arranged across the terminals of the RF coil may be needed to tune the RF coil to a desired resonant frequency.

FIG. 4 illustrates an implementation of tuning network 400, where each of tuning elements 302, 304, and 306 is implemented using a variable capacitor. For example, coupling tuning elements 302 and 304 are implemented using coupling capacitor 402 and coupling capacitor 404, and resonance tuning element 306 is implemented using resonance capacitor 406. In the implementation of FIG. 4, controller 310 may include one or more processors programmed to send control instructions to drive one or more motors (e.g., servo stepper motors) adapted to change the values of one or more of capacitors 402, 404, and 406 to achieve desired tuning characteristics of tuning network 400.

FIG. 5 illustrates an alternate implementation of tuning network 500, where each of tuning elements 302, 304, and 306 is implemented using a switched network of fixed-value capacitors. For example, coupling tuning element 302 is implemented using a network of fixed-value capacitors C1 . . . C4 connected with switches S1 . . . S4, coupling tuning element 304 is implemented using a network of fixed-value capacitors C5 . . . C8 connected with switches S5 . . . S8, and resonance tuning element 306 is implemented using a network of fixed-value capacitors C9 . . . C12 connected with switches S9 . . . S12. In the implementation of FIG. 5, controller 310 may be configured to control the state of switches S1 . . . S12 to selectively switch in or out capacitor branches of each of the fixed-value capacitor networks corresponding to tuning elements 302, 304, and 306 to produce a desired overall capacitance of the tuning network. Using fixed value capacitors enables a solid-state implementation of tuning network 500 that does not rely on mechanical devices (e.g., servo stepper motors) for adjusting the capacitance of the RF coil circuit during tuning. Switches S1 . . . S12 may be implemented using any suitable circuit components including, but not limited to, transistors, diodes (e.g., PIN diodes), MEMS-based switches, and relays.

Capacitors C1 . . . C12 may have any suitable capacitance values to provide a set of possible capacitance values within a desired tuning range. In some embodiments, each capacitor in a network corresponding to a tuning element has a different capacitance value to enable a maximum number of capacitance combinations over the desired dynamic range. Although four capacitors are shown for each of the capacitor networks shown in FIG. 5, it should be appreciated that any suitable number of capacitors may alternatively be used, and each tuning element may comprise the same or a different number of capacitors, as embodiments are not limited in this respect.

FIG. 6 illustrates an implementation of tuning network 600, where each of tuning elements 302, 304, and 306 is implemented using a switched network of fixed-value capacitors in which the digital switches of FIG. 5 are replaced with multi-channel analog switches. For example, coupling tuning element 302 is implemented using a network of fixed-value capacitors C1 . . . C4 connected to multi-channel analog switch 610, coupling tuning element 304 is implemented using a network of fixed-value capacitors C5 . . . C8 connected to multi-channel analog switch 612, and resonance tuning element 306 is implemented using a network of fixed-value capacitors C9 . . . C12 connected to multi-channel analog switch 614. In the implementation of FIG. 6, controller 310 may be configured to control the state of analog switches 610, 612, and/or 614 to selectively switch in or out capacitor branches of each of the fixed-value capacitor networks corresponding to tuning elements 302, 304, and 306 to produce a desired overall capacitance of the tuning network. Reducing the number of switches to be controlled by controller 310 by using multi-channel switches may simplify the layout of the resonant circuit by using fewer components.

The inventors have recognized and appreciated that precisely tuning RF coils with high quality (Q) values using tuning circuit 200 is difficult because the bandwidth of the resonance is of the coil is too narrow. Accordingly, a tuning circuit 200 in accordance with some embodiments may include one or more additional components to increase the bandwidth of the coil. In some embodiments, the series resistance of the RF coil may be increased by inserting one or more resistors in series with the RF coil loop. This technique is sometimes referred to as Q-spoiling, because it reduces the quality factor (Q) of the RF coil by increasing the series resistance of the coil.

Other embodiments may facilitate the tuning of high-Q RF coils using techniques that are lossless or less lossy than increasing the series resistance of the coil. For example, a high impedance operational amplifier may be arranged in parallel with capacitor 306. In other embodiments, tuning circuit 200 may include a second tuning network to perform "frequency pulling" to improve tuning. In yet other embodiments, tuning circuit 200 may include a transformer interposed between balun 204 and the inputs of tuning network 600. The transformer may be implemented using a suitable down transformer, for example, a four-to-one down transformer, a two-to-one down transformer, etc. By using such a transformer at the input, resonance circuit 600 may be loaded with a lower resistance. In yet other embodiments, a directional coupler 710 may be inserted before balun 204 to measure the input port voltage reflection coefficient (S11) as shown in FIG. 7. Directional coupler 710 may alternatively be inserted in-line with the transmit path in the RF signal chain so as to not add insertion losses, which lead to an increase in the receive noise floor. In yet other embodiments, a fuse 810 is arranged in-line before balun 204 to limit the RF transmit current. Alternatively, fuse 810 may be arranged before Tx/Rx switch 116 in the RF signal chain so that fuse 810 is not in-line with the receive path, thereby reducing insertion losses and increasing the receive noise floor.

FIG. 9 shows an alternate tuning circuit 900 that may be used to tune receive-only RF coils in accordance with some embodiments. When the tuning circuit is configured for use with receive-only RF coils, lower voltage components can be used than for tuning circuits for Tx/Rx coils. Additionally, a Tx/Rx switch does not need to be included, further simplifying the circuit design.

Tuning circuit 900 includes a tuning network, in accordance with some embodiments. Tuning circuit 900 includes eight capacitive branches C1 . . . C8, which may be selectively switched in or out of the overall capacitance of the RF coil circuit to tune an RF coil to a desired resonant frequency. As shown, each of the top and bottom half of tuning circuit 900 includes multi-channel analog switches 902, 904 that can be controlled to switch in or out each capacitive branch of the tuning circuit. Tuning circuit 900 is connected to an amplifier 910, which amplifies the received MR signal. Although eight capacitor branches are shown in FIG. 9, it should be appreciated that any other suitable number of branches may be used. In some embodiments, an equal number of switches may be used on each side of tuning circuit 900, as shown, to balance the parasitic capacitances produced by each switch. In other embodiments, an unbalanced tuning circuit may be used.

Tuning circuits in accordance with some embodiments may be configured to automatically tune an attached RF coil in response to a series of differential measurements. For example, initial tuning parameters may initially be set (e.g., based on values in a look-up table associated with controller 310 and/or values received from a storage device associated with an attached coil), and noise measurements may be collected using the initial tuning parameters. A first average noise spectrum may be generated from the noise measurements. The values of one or more of the tuning elements in the tuning circuit may then be changed, and additional noise measurements may be collected using the new tuning parameters. A second average noise spectrum may be generated from the second set of noise measurements, and the first average noise spectrum may be compared to the second average noise spectrum to evaluate how the average noise spectrum changes. A series of differential measurements may continue to be performed to determine the best combination of tuning element values to optimally tune the RF coil.

The above described tuning systems illustrate a number of techniques by which the resonant frequency of a RF coil can be modified. However, the precision of tuning a RF coil to a specific frequency may be unsatisfactorily approximate unless the frequency to which the RF coil is currently tuned is determined. The inventors have developed a technique of using the electromagnetic noise in an environment of a RF coil to determine the current resonant frequency of the RF coil. In conventional MRI, the MRI system (including the RF coils) operates in a specially shielded room configured to attenuate electromagnetic noise to negligible levels (e.g., essentially attenuating electromagnetic noise to zero). Accordingly, the technique described hereinafter was heretofore not contemplated. As discussed above, the inventors have developed low-field MRI systems that may be configured to operate outside of specially shielded rooms. For example, noise suppression techniques described in U.S. Pat. No. 9,625,543, titled "Noise Suppression Methods and Apparatus," which is herein incorporated by reference in its entirety, may be used to allow a MRI system to operate outside specially shielded rooms.

The inventors recognized that the electromagnetic noise present in the environment can be used to determine a current resonant frequency of a RF coil so that the RF coil can be more precisely matched to the Larmor frequency, examples of which are discussed in further detail below. For example, FIG. 10A illustrates an example electromagnetic noise spectrum of the environment of an MRI system (e.g., a MRI system operating outside a shielded room such as in an emergency room, doctors office, etc.). FIG. 10B illustrates the example electromagnetic noise spectrum illustrated in FIG. 10A as detected by an RF coil tuned to a given frequency (e.g., tuned to resonate at 735 kHz in this example). As shown, there is a peak in the response of the RF coil to the electromagnetic noise at the resonant frequency because the RF coil responds most strongly to noise at its resonant frequency. This property can be utilized to determine the current resonant frequency at which a RF coil is tuned. For example, the electromagnetic noise spectrum detected by an RF coil can be analyzed to identify the frequency at which the RF coil has a peak response, thereby determining the current resonant frequency of the RF coil. By determining the frequency at which an RF coil currently resonates, the RF coil can thereafter be tuned to match the Larmor frequency with greater precision, examples of which are described in further detail below.

FIG. 11 illustrates a method 1100 for tuning a RF coil to resonate at a desired or actual Larmor frequency, in accordance with some embodiments. In act 1110, a Larmor frequency is obtained. According to some embodiments, the Larmor frequency obtained is a Larmor frequency corresponding to a desired $B_0$ magnetic field. According to some embodiments, the Larmor frequency is an actual Larmor frequency that is, e.g., estimated or measured by the RF coil. For example, the Larmor frequency may be determined by exciting and detecting MR signals emitted from a sample to determine the frequency of the MR signals (which correspond to the actual Larmor frequency). According to some embodiments, a controller is configured to determine the actual Larmor frequency (e.g., a controller comprising one or more processors may be configured to operate the RF coil to excite an MR response and to analyze the detected MR signals to determine the Larmor frequency) so that act 1110 may be performed automatically by the controller. According to some embodiments, the response of the RF coil to emitted MR signals is analyzed to identify the frequency at which the RF coil response is decaying to determine the corresponding Larmor frequency. That is, the frequency at which the RF coil response exhibits characteristic MR decay indicates the actual Larmor frequency. However, the actual Larmor frequency may be determined using any suitable technique.

In act 1120, the electromagnetic noise in the environment (e.g., in the environment of the MRI system to which the RF coil is being tuned) is detected using the RF coil and, in act 1130, the spectra of the detected electromagnetic noise is analyzed to identify the frequency at which the RF coil exhibited a maximum response to determine the current resonant frequency of the RF coil. According to some embodiments, the controller is configured to operate the RF coil to detect electromagnetic noise and is further configured to analyze the electromagnetic noise spectrum to identify the resonant frequency (e.g., via one or more processors configured to control the RF coil and/or process the resulting electromagnetic noise spectrum to identify the frequency at the peak response of the RF coil). In act 1135, the determined resonant frequency is compared to the obtained Larmor frequency and, if there is a match (e.g., the determined resonant frequency is equal to or sufficiently close to the Larmor frequency), the RF coil is considered tuned to resonate at the Larmor frequency with sufficient precision.

If there is not a match, the RF coil is tuned to modify the resonant frequency of the RF coil (act 1140). For example, any of the tuning systems described herein may be used to configure one or more tuning elements to modify the resonant frequency of the RF coil. According to some embodiments, the controller coupled to a tuning circuit may be configured to cause the one or more tuning elements to be modified based on the difference between the resonant frequency of the RF coil (e.g., determined by performing acts 1120 and 1130) and the obtained Larmor frequency (e.g., obtained by performing act 1110). After tuning the RF coil (e.g., after adjusting a tuning circuit coupled to the RF coil), acts 1120 and 1130 are repeated using the RF coil with the new tuning parameter(s) (e.g., the RF coil tuned by performing act 1140). This process may be repeated until the resonant frequency of the RF coil matches the obtained Larmor frequency (e.g., acts 1120, 1130, 1135 and 1140 may be repeated iteratively until the resonant frequency determined in acts 1120 and 1130 at the current RF coil tuning is equal to or sufficiently close to the Larmor frequency). According to some embodiments, a controller is configured to perform method 1100 to facilitate automatic tuning of an RF to a specified frequency (e.g., a desired or actual Larmor frequency obtained in act 1110).

FIGS. 12A, 12B and 13 illustrate a method of determining a resonant frequency of a RF coil using differential measurements. FIG. 12A illustrates an example noise spectrum of an RF coil tuned at three different tuning frequencies (e.g., nominally 732 kHz, 736 kHz, and 740 kHz). However, the precise resonant frequencies may not be precisely known. Tuning the RF coil at different frequencies results in differences in the tuned noise spectrum near the tuning frequencies, as shown more clearly in FIG. 12B. FIG. 12B shows the noise spectrum of FIG. 12A zoomed in to the region surrounding the tuning frequencies to reveal separate noise spectra 1210, 1220 and 1230 detected by the RF coil tuned at frequencies 732 kHz, 736 kHz and 740 kHz, respectively. Dashed lines representing the three nominal tuning frequencies (732 kHz, 736 kHz, and 740 kHz) are also shown.

As discussed above, differential tuning measurements may be used in some embodiments to tune an RF coil. For example, the ratio of noise spectra tuned to different frequencies may be determined and used to tune an RF coil to a desired frequency. FIG. 13 shows a plot of ratios of noise spectra tuned to different frequencies from FIG. 12B to illustrate the concept of using differential tuning measurements to tune an RF coil. A first trace 1325 in FIG. 13 corresponds to the noise spectrum nominally tuned to 736 kHz divided by the noise spectrum nominally tuned to 740 kHz, and a second trace 1315 in FIG. 13 corresponds to the noise spectrum nominally tuned to 732 kHz divided by the noise spectrum nominally tuned to 736 kHz. Because the same general noise spectrum is tuned for each of multiple tuning frequencies, the ratio of noise spectra tuned to different frequencies reflects a cancellation of the common noise structure for the different tunings. As shown, a comparison of the two ratios plotted in FIG. 13 reveals the actual tuning of the RF coil, as indicated by the frequency at the intersection of the traces for the two ratios. That is, the intersection of the traces can be used to determine that actual resonant frequency of the RF coil when tuned nominally to 736 kHz.

In the example tuning using differential measurements to tune an RF coil described above in connection with FIGS. 12A, 12B and 13, a frequency spacing of two kHz was used. However, it should be appreciated that any suitable frequency spacing may be used for performing differential measurements, and embodiments are not limited in this respect. Additionally, the frequency spacing may be determined using any suitable factor or factors. For example, the frequency spacing may be determined based, at least in part, on the bandwidth of the RF coil to be tuned, with a smaller frequency spacing being used to tune RF coils having narrower bandwidths and a larger frequency spacing being used to tune RF coils with broader bandwidths. In some embodiments, a metric based on the quality (Q) factor of the RF coil may be used to determine the frequency spacing used for differential measurements to tune the coil. For example, in one implementation the frequency spacing may be determined in accordance with the relation Q/10.

FIG. 14 illustrates a method of tuning one or more RF coils to operate with a MRI system, in accordance with some embodiments. Method 1400 may be performed, for example, using the tuning systems illustrated in FIGS. 2-9 and described in the accompanying descriptions to automatically tune one or more RF coils to resonate at a desired Larmor frequency. In act 1410, information indicative of a Larmor frequency of a MRI system is obtained. Information indicative of a Larmor frequency may be obtained in a number of ways, including receiving information indicative of a desired Larmor frequency (e.g., receiving a desired Larmor frequency and/or a desired $B_0$ magnetic field strength) and/or determining information about an actual Larmor frequency (e.g., estimating or measuring an actual Larmor frequency from measure MR signals, measuring the actual $B_0$ magnetic field currently produced by the $B_0$ magnet of the MRI system, etc.). That is, information indicative of a Larmor frequency may be obtained by receiving information about a desired Larmor frequency, determining information about an actual Larmor frequency resulting from the actual $B_0$ magnet field currently produced by the $B_0$ magnet, or both, further detail of which are discussed below.

According to some embodiments, information indicative of a Larmor frequency is obtained (act 1410) by receiving the information in a suitable manner. For example, information indicative of a Larmor frequency (e.g., a desired Larmor frequency, a desired $B_0$ magnetic field strength, etc.) may be received from the system console (e.g., in dependence on a desired imaging protocol to be performed), from data stored in association with a given RF coil, or in any other suitable manner. It should be appreciated that, in some embodiments, act 1400 may be performed without obtaining an explicit value for the Larmor frequency and/or $B_0$ magnetic field strength. Instead, one or more values related to the Larmor frequency and/or $B_0$ magnetic field strength, one or more values for parameters of the tuning circuit, or any other suitable value that facilitates tuning RF coil(s) appropriately may be obtained (e.g., instead of explicit frequency and/or field strength values). That is, receiving information indicative of a Larmor frequency includes receiving information used to tune RF coil(s) to resonate at approximately the Larmor frequency (e.g. the Larmor frequency associated with a desired $B_0$ magnetic field strength).

According to some embodiments, information indicative of a Larmor frequency is obtained (act 1410) by determining (e.g., measuring, computing, etc.) information indicative of an actual Larmor frequency resulting from the actual $B_0$ magnetic field currently produced by the $B_0$ magnet. Determining information indicative of the actual Larmor frequency may be performed using any suitable technique including, but not limited to, estimating the current Larmor frequency from measured MR signals, measuring a current $B_0$ magnetic field strength, etc. For example, act 1410 may be performed by performing any of the techniques described in connection with act 1100 of method 1100 described in connection with FIG. 11. In this manner, one or more RF coils may be tuned to the actual operating parameters of the MRI system. For example, the actual Larmor frequency may deviate from the Larmor frequency corresponding to the nominal $B_0$ field at which the MRI system is intended to operate due to deviation in the actual $B_0$ field strength (e.g., deviations resulting from offsets, inhomogeneity, magnet drift, environmental factors, etc.) By estimating, measuring, computing or otherwise determining the actual Larmor frequency (e.g., by evaluating the frequency of MR signal decay from actual MR measurements), RF coil(s) of the MRI system can be tuned to more closely match the actual Larmor frequency to improve SNR. Similarly, other techniques for estimating and/or measuring the actual operating parameters of the MRI system to facilitate tuning RF coils to more precisely resonate at the actual Larmor frequency may be used to increase the SNR of MR signal acquisition.

In act 1420, one or more RF coils are tuned based, at least in part, on the information obtained in act 1410. For example, the information obtained in act 1410 may be used by a controller to automatically tune one or more RF coils. According to some embodiments, method 1100 illustrated in FIG. 11 and described in the accompanying description may be used to tune one or more RF coils to the indicated Larmor frequency. For example, act 1420 may be performed by iteratively performing acts 1120, 1130, 1135 and 1140 of method 1100 and/or using any of the techniques described therein. However, other methods of tuning an RF coil to a specified resonant frequency may be used, as the aspects are not limited in this respect. It should be appreciated that any of the tuning systems described herein may be used to facilitate automatically tuning one or more RF coils to resonate at a desired frequency, or any other suitable tuning system may be used, as the aspects are not limited in this respect. Once the RF coil(s) of an MRI system are tuned accordingly, the tuned RF coils(s) may be operated in conjunction with the other components of the MRI system to acquire one or more images (act 1430).

Accordingly, method 1400 may be performed to tune RF coils in a number of different circumstances. For example, method 1400 may be performed to automatically tune the RF coil(s) of an MRI system to resonate at the Larmor frequency corresponding to a nominal or intended $B_0$ field strength of the MRI system. For example, one or more RF coils can be tuned to operate with an MRI system having a nominal $B_0$ field strength of 50 mT and can also be tuned to operate with a different MRI system having a nominal $B_0$ field strength of 0.1 T by receiving the Larmor frequency at the nominal $B_0$ field strength or receiving the nominal $B_0$ field strength itself and tuning RF coils accordingly. In this manner, RF coils may be tuned to operate with different MRI systems or a single MRI system without requiring costly manual tuning of the RF coils. As another example, method 1400 may be performed to tune one or more RF coils to operate with an MRI system that is configured to operate at different $B_0$ field strengths. For example, an MRI system may be configured to produce a $B_0$ magnetic field at different field strengths to, for example, perform different imaging protocols. In particular, an MRI system may be configured to operate at a first $B_0$ magnetic field strength when acquiring images in accordance with a first contrast type (e.g., T1, T2, etc.), configured to operate at a second $B_0$ magnetic field strength when acquiring images using a second contrast type (e.g., diffusion weighted imaging (DWI), and/or configured to operate at a third $B_0$ magnetic field strength when acquiring images using a third contrast type (e.g., OMRI). As another example, an MRI system may be configured to operate at different $B_0$ magnetic field strengths to avoid noise in a particular RF spectrum, and method 1400 may be performed to tune RF coil(s) to an MRI system that has been dynamically configured to operate in an RF spectrum exhibiting less electromagnetic noise than another spectra. Accordingly, method 1400 may be performed to automatically tune RF coil(s) to resonate at a frequency corresponding to a desired $B_0$ magnetic field strength of an MRI system that is configurable to produce multiple $B_0$ magnetic field strengths.

As discussed above, method 1400 may also be performed to tune RF coil(s) to actual operating parameters of an MRI system so that, for example, the RF coil(s) resonate at a frequency that more closely matches the actual Larmor frequency resulting from the actual $B_0$ magnetic field currently produced by the $B_0$ magnet of the MRI system. Accordingly, method 1400 may be performed to more precisely tune RF coil(s) to the MRI system to improve SNR. It should be appreciated that techniques of tuning RF coil(s) by estimating or measuring the actual operating parameters of the MRI system (e.g., estimating an actual Larmor frequency and/or measuring an actual $B_0$ magnetic field strength) can be used alone or in combination with techniques for tuning RF coil(s) to the nominal (e.g., intended or target) operating parameters of the MRI system (e.g., the Larmor frequency at a desired $B_0$ magnetic field strength). For example, RF coil(s) may be tuned to resonate at approximately the Larmor frequency corresponding to a desired $B_0$ magnetic field strength as a first approximation (e.g., by performing acts 1410 and 1420), followed by tuning RF coil(s) to resonate approximately at the actual Larmor frequency resulting from the actual $B_0$ magnetic field currently produced by the $B_0$ magnet of the MRI system to more closely match the resonant frequency of the RF coil(s) to the actual Larmor frequency (e.g., by again performing acts 1410 and 1420 as shown by the optional dotted line in FIG. 14).

It should be appreciated that in embodiments where tuning to nominal is followed by tuning to actual, the tuning operations may be separated temporally (e.g., tuning to nominal may be performed at the factory or at the time of deployment or installation and tuning to actual may be performed just prior to image acquisition) and/or the tuning operations may be performed in close temporal succession (e.g., both tuning operations may be performed just prior to image acquisition). It should be further appreciated that one or the other tuning operations may be performed without performing the other. For example, according to some embodiments, RF coil(s) are tuned to nominal (e.g., tuned to the Larmor frequency of a desired $B_0$ field strength) without performing further tuning based on estimated and/or measured operating parameters of the MRI system. Similarly, RF coil(s) may be tuned to the actual operating parameters of the MRI system (e.g., tuned to the actual Larmor frequency resulting from an actual $B_0$ field) without performing a tuning operation based on received nominal values of the Larmor frequency and/or $B_0$ magnetic field strength, as the aspects are not limited in this respect.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. For example, a controller may comprise one or more computing devices to execute program instructions to perform any method or portions thereof described herein. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

An illustrative implementation of a computing device 1500 that may be used to implement one or more techniques described herein is shown in FIG. 15. For example, a controller configured to control various aspect of a magnetic resonance imaging system may include, among other controlling features, one or more computing devices 1500 configured to perform one or more aspects of the automatic tuning techniques described herein. Computing device 1500 may include one or more processors 1510 and one or more non-transitory computer-readable storage media (e.g., memory 1520 and one or more non-volatile storage media 1530). The processor 1510 may control writing data to and reading data from the memory 1520 and the non-volatile storage device 1530 in any suitable manner, as the aspects of the invention described herein are not limited in this respect. Processor 1510, for example, may be a processor on an activity tracking device, mobile device, personal computing device, game device, client device, server device and/or any computing device accessible via a network (e.g., cloud accessible).

To perform functionality and/or techniques described herein, the processor 1510 may execute one or more instructions stored in one or more computer-readable storage media (e.g., the memory 1520, storage media, etc.), which may serve as non-transitory computer-readable storage media storing instructions for execution by processor 1510. Computing device 1500 may also include any other processor, controller or control unit needed to route data, perform computations, perform I/O functionality, etc. For example, computing device 1500 may include any number and type of input functionality to receive data and/or may include any number and type of output functionality to provide data, and may include control apparatus to perform I/O functionality.

In connection with performing techniques described herein, one or more programs configured to receive information, process the information or otherwise execute functionality described herein may be stored on one or more computer-readable storage media of computing device 1500. In particular, some techniques described herein may be implemented as instructions stored on one or more computer-readable storage media. Processor 1510 may execute any one or combination of such programs that are available to the processor by being stored locally on computing device 1500 or accessible over a network. Any other software, programs or instructions described herein may also be stored and executed by computing device 1500. As discussed above, computing device 1500 may represent the computing device on a controller, as part of a console, as part of a network computer system, etc. Computing device 1500 may be implemented as a standalone computer, server, part of a distributed computing system, and may be connected to a network and capable of accessing resources over the network and/or communicate with one or more other computers connected to the network.

The terms "program" or "software" are used herein in a generic sense to refer to any type of computer code or set of processor-executable instructions that can be employed to program a computer or other processor to implement various aspects of embodiments as discussed above. Additionally, it should be appreciated that according to one aspect, one or more computer programs that when executed perform methods of the disclosure provided herein need not reside on a single computer or processor, but may be distributed in a modular fashion among different computers or processors to implement various aspects of the disclosure provided herein.

Processor-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A method of automatically tuning a radio frequency (RF) coil configured to receive and/or transmit RF signals and for use with a magnetic resonance imaging (MRI) system using a tuning circuit connected to the RF coil, the method comprising:
obtaining information indicative of a Larmor frequency of the MRI system; and
using a controller of the MRI system:
controlling the RF coil to detect electromagnetic noise in an environment of the MRI system;
determining a resonant frequency of the RF coil based on the detected electromagnetic noise; and
setting, based on the determined resonant frequency, at least one value of the tuning circuit to cause the RF coil to resonate at approximately the Larmor frequency.

2. The method of claim 1, wherein obtaining information indicative of the Larmor frequency comprises estimating a Larmor frequency of the MRI system.

3. The method of claim 2, wherein estimating the Larmor frequency comprises measuring magnetic resonance signals emitted from a sample.

4. The method of claim 1, wherein obtaining information indicative of a Larmor frequency comprises measuring a $B_0$ magnetic field strength produced by the MRI system.

5. The method of claim 1, wherein determining the resonant frequency of the RF coil comprises identifying a frequency in spectra of the detected electromagnetic noise at which the RF coil exhibits a maximum response.

6. A tuning system configured to tune a radio frequency (RF) coil configured to receive and/or transmit RF signals and for use with a magnetic resonance imaging (MRI) system, the tuning system comprising:
a tuning circuit including at least one tuning element configured to affect a frequency at which the RF coil resonates; and
a controller configured to set at least one value for the at least one tuning element to cause the RF coil to resonate at approximately a Larmor frequency of the MRI system obtained by the tuning system,
wherein the controller is configured to control the RF coil to detect electromagnetic noise in an environment of the MRI system, to determine a resonant frequency of the RF coil based on the detected electromagnetic noise, and to use the determined resonant frequency to set the at least one value of the at least one tuning element.

7. The tuning system of claim 6, wherein information indicative of the Larmor frequency is obtained by the tuning system at least in part by estimating a Larmor frequency of the magnetic resonance system.

8. The tuning system of claim 7, wherein estimating the Larmor frequency comprises measuring magnetic resonance signals emitted from a sample using the RF coil.

9. The tuning system of claim 7, wherein the information indicative of the Larmor frequency is obtained by the tuning system at least in part by measuring a $B_0$ magnetic field strength produced by the MRI system using at least one sensor.

10. The tuning system of claim 6, wherein the controller is configured to identify a frequency in spectra of the detected electromagnetic noise at which the RF coil exhibits a maximum response.

11. The tuning system of claim 6, wherein the tuning circuit comprises a balanced tuning network.

12. The tuning system of claim 6, wherein the at least one tuning element comprises at least one configurable tuning element comprising a variable capacitor, and wherein the controller is configured to send at least one control instruction to drive one or more motors adapted to set the at least one value for the at least one configurable tuning element.

13. The tuning system of claim 6, wherein the at least one tuning element comprises a switched network of fixed-value capacitors, wherein the switched network includes a plurality of capacitive branches, and wherein the controller is configured to control the state of switches in each of the plurality of capacitive branches to set the value for the at least one tuning element.

14. The tuning system of claim 6, wherein the at least one tuning element includes a first coupling tuning element arranged between a first input of the tuning circuit and the first output of the tuning circuit and a second coupling tuning element arranged between a second input of the tuning circuit and the second output of the tuning circuit.

15. The tuning system of claim 14, wherein the first coupling tuning element and/or the second coupling tuning element comprises a variable capacitor, and wherein the controller is configured to send at least one control instruction to drive one or more motors adapted to set a value for the first coupling tuning element and/or the second coupling tuning element.

16. The tuning system of claim 14, wherein the first coupling tuning element and/or the second coupling tuning element comprises a switched network of fixed-value capacitors, wherein the switched network includes a plurality of capacitive branches, and wherein the controller is configured to control the state of switches in each of the plurality of capacitive branches to set a value for the first coupling tuning element and/or the second coupling tuning element.

17. The tuning system of claim 16, wherein at least one tuning element comprises a switched network of fixed-value capacitors, wherein the switched network includes a plurality of capacitive branches, and wherein the controller is configured to control the state of switches in each of the plurality of capacitive branches to set the value for the at least one tuning element.

18. The tuning system of claim 6, wherein the MRI system is a low-field MRI system.

19. The tuning system of claim 18, wherein a field strength of the low-field MRI system is less than or equal to 0.1 T and greater than or equal to 50 mT.

20. A magnetic resonance imaging (MRI) system, comprising:
a $B_0$ magnet configured to provide a $B_0$ field;
at least one radio frequency (RF) coil configured to receive and/or transmit RF signals; and
a tuning system configured to tune the at least one RF coil, the tuning system comprising:
a tuning circuit including at least one tuning element configured to affect a frequency at which the RF coil resonates; and
a controller configured to set at least one value for the at least one tuning element to cause the at least one RF coil to resonate at approximately a Larmor frequency of the MRI system obtained by the tuning system,
wherein the controller is configured to control the at least one RF coil to detect electromagnetic noise in an environment of the MRI system, to determine a resonant frequency of the RF coil based on the detected electromagnetic noise, and to use the determined resonant frequency to set the at least one value of the at least one tuning element.

\* \* \* \* \*